United States Patent
Son et al.

(10) Patent No.: US 9,508,726 B2
(45) Date of Patent: Nov. 29, 2016

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Yoonho Son, Yongin-si (KR); Mongsup Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/803,217

(22) Filed: Jul. 20, 2015

(65) Prior Publication Data

US 2016/0049407 A1    Feb. 18, 2016

(30) Foreign Application Priority Data

Aug. 18, 2014 (KR) ........................ 10-2014-0107141

(51) Int. Cl.
| | |
|---|---|
| *H01L 29/06* | (2006.01) |
| *H01L 21/3213* | (2006.01) |
| *H01L 27/108* | (2006.01) |
| *H01L 21/768* | (2006.01) |
| *H01L 21/311* | (2006.01) |

(52) U.S. Cl.
CPC .... *H01L 27/10876* (2013.01); *H01L 21/31111* (2013.01); *H01L 21/31116* (2013.01); *H01L 21/32133* (2013.01); *H01L 21/76801* (2013.01); *H01L 21/76877* (2013.01); *H01L 27/10814* (2013.01); *H01L 27/10823* (2013.01); *H01L 27/10855* (2013.01); *H01L 27/10885* (2013.01); *H01L 27/10888* (2013.01)

(58) Field of Classification Search
CPC ............... H01L 21/76801; H01L 21/76804; H01L 21/76831; H01L 27/10876; H01L 27/10885; H01L 27/10888; H01L 27/10814; H01L 21/3111; H01L 21/31116; H01L 29/0653; H01L 21/32133
See application file for complete search history.

(56) References Cited

U.S. PATENT DOCUMENTS

| | | | |
|---|---|---|---|
| 8,309,449 B2 | 11/2012 | Jeong et al. | |
| 8,319,264 B2* | 11/2012 | Kim ................. | H01L 27/10888 257/296 |
| 8,404,543 B2 | 3/2013 | Shin et al. | |
| 8,558,306 B2* | 10/2013 | Kim ................. | H01L 21/76897 257/213 |
| 8,648,423 B2 | 2/2014 | Han et al. | |
| 8,815,687 B2* | 8/2014 | Park ................. | H01L 21/76804 257/330 |
| 8,835,252 B2* | 9/2014 | Moon ............... | H01L 27/10823 438/253 |
| 8,921,223 B2 | 12/2014 | Lee | |
| 2010/0327346 A1* | 12/2010 | Jeong ............... | H01L 21/76804 257/332 |
| 2010/0330775 A1 | 12/2010 | Shin et al. | |
| 2011/0212607 A1* | 9/2011 | Kim ................. | H01L 21/28525 438/514 |
| 2012/0091532 A1 | 4/2012 | Han et al. | |
| 2013/0093093 A1 | 4/2013 | Lee | |
| 2013/0240959 A1 | 9/2013 | Lee et al. | |

FOREIGN PATENT DOCUMENTS

| | | |
|---|---|---|
| JP | 2013182926 A | 9/2013 |
| KR | 20050045715 A | 5/2005 |
| KR | 20080084428 A | 9/2008 |
| KR | 20110119047 A | 11/2011 |

\* cited by examiner

*Primary Examiner* — Savitr Mulpuri
(74) *Attorney, Agent, or Firm* — Harness, Dickey & Pierce, P.L.C.

(57) ABSTRACT

A semiconductor device includes a device isolation pattern on a substrate to define active patterns, a gate electrode crossing the active patterns, first and second impurity regions in each of the active patterns and on both sides of the gate electrode, a bit line crossing the gate electrode, a first contact electrically connecting the first impurity region to the bit line, and a second contact electrically connected to the second impurity region. The second contact includes a vertically-extended portion covering an upper side surface of the second impurity region.

5 Claims, 43 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0107141, filed on Aug. 18, 2014, in the Korean Intellectual Property Office, the entire contents of which are hereby incorporated by reference.

BACKGROUND

1. Field

Some example embodiments of the inventive concepts relate to a semiconductor device, and in particular, to a dynamic random access memory (DRAM) device and a method of fabricating the same.

2. Description of the Related Art

Due to their small-size, multifunctionality, and/or low-cost characteristics, semiconductor devices are considered important elements in the electronic industry. The semiconductor devices can be generally classified into a memory device for storing data, a logic device for processing data, and a hybrid device capable of performing various memory storage and data processing functions simultaneously.

Higher integration of semiconductor devices is required to satisfy consumer demands for electronic devices with a relatively fast speed. However, owing to a decreasing process margin in a photolithography process, it is becoming harder to realize the highly-integrated semiconductor devices. To overcome such a limitation, there have been recently done a variety of studies on new technology for increasing an integration density of the semiconductor device.

SUMMARY

Some example embodiments of the inventive concepts provide a highly-integrated semiconductor device.

Other example embodiments of the inventive concepts provide a method of fabricating a highly-integrated semiconductor device.

According to some example embodiments of the inventive concepts, a semiconductor device includes a device isolation pattern on a substrate, the device isolation pattern defining active patterns, a gate electrode crossing the active patterns, a first impurity region and a second impurity region in each of the active patterns and on both sides of the gate electrode, a bit line crossing the gate electrode, a first contact electrically connecting the first impurity region to the bit line, and a second contact electrically connected to the second impurity region. The second contact may include a vertically-extended portion covering an upper side surface of the second impurity region.

In example embodiments, the first impurity region and the device isolation pattern adjacent to the first impurity region may define a bottom surface of a recess region. The bottom surface of the recess region may be lower than a top surface of the substrate, and a bottom surface of the vertically-extended portion may be lower than the bottom surface of the recess region.

In example embodiments, the vertically-extended portion may be inserted into an upper portion of the device isolation pattern adjacent to the second impurity region and extends toward a bottom surface of the substrate.

In example embodiments, the second contact may further include a horizontally-extended portion covering a portion of a top surface of the second impurity region.

In example embodiments, the device may further include a nitride pattern on a side surface of the first contact, and a spacer covering a side surface of the bit line. A first portion of the spacer may cover a top surface of the nitride pattern, and a second portion of the spacer different from the first portion may overlap the horizontally-extended portion when viewed in a plan view.

In example embodiments, the spacer may include first, second, and third spacers sequentially covering the side surface of the bit line. The second and third spacers may cover a top surface of the nitride pattern, and the first spacer may extend to cover a top surface of the device isolation pattern and enclose a lower portion of the nitride pattern.

In example embodiments, the device may further include a nitride pattern on a side surface of the first contact. The first contact may be in a first portion of the recess region and the nitride pattern may fill a second portion of the recess region different from the first portion.

In example embodiments, the first impurity region may define a first recess having a first depth from a top surface of the substrate, and the second impurity region may define a second recess having a second depth from the top surface of the substrate. The device isolation pattern may define a third recess adjacent to the second recess and having a third depth from the top surface of the substrate. Here, the first depth may be greater than the second depth, the third depth may be greater than the first depth, and the vertically-extended portion may be in the third recess.

According to other example embodiments of the inventive concepts, a method of fabricating a semiconductor device includes forming a gate electrode in a substrate with active patterns defined by a device isolation pattern, forming first and second impurity regions in each of the active patterns and on both sides of the gate electrode, forming an interlayered insulating pattern on the substrate with the first and second impurity regions, forming a preliminary contact on the gate electrode and the first and second impurity regions to penetrate the interlayered insulating pattern and be electrically connected to the first impurity region, forming a conductive layer on the preliminary contact, etching the conductive layer and the preliminary contact to form a bit line crossing the gate electrode and a contact, respectively, forming a first contact hole to expose top surfaces of the second impurity region and the device isolation pattern adjacent to the second impurity region, and etching the top surface of the device isolation pattern exposed by the first contact hole.

In example embodiments, forming the interlayered insulating pattern may include forming an interlayered insulating layer on the substrate with the first and second impurity regions and etching the interlayered insulating layer to form a second contact hole exposing a portion of the first impurity region and a portion of the device isolation pattern adjacent to the first impurity region. Forming the preliminary contact may include etching the exposed portions of the first impurity region and the device isolation pattern to form a recess region connected to the second contact hole and filling the second contact hole and the recess region with a conductive material.

In example embodiments, the etching the conductive layer and the preliminary contact may include forming a first mask pattern extending parallel to the bit line on the conductive layer, etching the conductive layer using the first mask pattern as an etch mask to form the bit line, and etching the preliminary contact using the first mask pattern and the bit line as an etch mask to form the contact.

In example embodiments, forming the first contact hole may include forming a first spacer to cover a side surface of the bit line, forming an etch-stop layer on the substrate to cover the first spacer, forming a second mask pattern on the first mask pattern, the second mask pattern extending parallel to the bit line, and etching the etch-stop layer and the interlayered insulating pattern using the first and second mask patterns as an etch mask to form the first contact hole.

In example embodiments, the method may further include etching a side surface of the interlayered insulating pattern exposed by the first contact hole. The etching the side surface of the interlayered insulating pattern may etch the top surface of the device isolation pattern.

In example embodiments, the etching of the top surface of the device isolation pattern may include selectively etching an oxide layer of the device isolation pattern using a dry etching process.

In example embodiments, the method may further include forming a nitride layer on the substrate to fill the recess region and cover side surfaces of the contact and the bit line, and performing a wet etching process on the nitride layer to form a nitride pattern in the recess region after the etching the conductive layer and the preliminary contact.

According to still other example embodiments of the inventive concepts, a method of fabricating a semiconductor device includes forming impurity regions in active patterns defined by a first oxide pattern in a substrate, forming a second oxide pattern on the substrate, etching the second oxide pattern to form a first contact hole exposing the first oxide pattern, selectively etching the first and second oxide patterns exposed by the first contact hole using a dry etching process, and forming a contact electrically connected to at least one of the impurity regions, the contact filling the first contact hole.

In example embodiments, the selectively etching may etch first and second silicon oxide patterns.

In example embodiments, the selectively etching may etch exposed upper portions of the first oxide pattern and the exposed side surfaces of the second oxide pattern.

In example embodiments, the selectively etching may etch the first and second oxide patterns at a temperature ranging from about 20° C. to about 250° C.

In example embodiments, the selectively etching may etch the first and second oxide patterns using an etch gas containing at least one of $NH_3$, HF, Ar and $N_2$.

In example embodiments, the method may further include etching a side surface of the second oxide pattern exposed by the first contact hole, wherein the etching etches the top surface of the first oxide pattern.

In example embodiments, forming the second oxide pattern may include forming an oxide layer on the substrate with the impurity regions, and etching the oxide layer to form a second contact hole exposing a portion of one of the impurity regions and a portion of the first oxide pattern adjacent to the one of the impurity regions.

In example embodiments, forming the contact may include forming a gate electrode in the substrate, forming a preliminary contact on the gate electrode and the impurity regions to penetrate the second oxide pattern and be electrically connected to one of the impurity regions, and etching the preliminary contact to form the contact.

In example embodiments, the method may further include forming a conductive layer on the preliminary contact prior to the etching, and etching the conductive layer and the preliminary contact to form a bit line crossing the gate electrode and the contact, respectively.

In example embodiments, etching the second oxide pattern may include forming a first spacer to cover a side surface of the bit line, forming an etch-stop layer on the substrate to cover the first spacer, forming a second mask pattern on the first mask pattern, the second mask pattern extending parallel to the bit line, and etching the etch-stop layer and the second oxide pattern using the first and second mask patterns as an etch mask to form the first contact hole.

In example embodiments, forming the preliminary contact may include etching exposed portions of one of the impurity regions and the first oxide pattern to form a recess region connected to the second contact hole, and filling the second contact hole and the recess region with a conductive material.

In example embodiments, the method may further include forming a nitride layer on the substrate to fill the recess region and cover side surfaces of the contact and the bit line, and performing a wet etching process on the nitride layer to form a nitride pattern in the recess region after the etching the conductive layer and the preliminary contact.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 14A are plan views illustrating a method of fabricating a semiconductor device according to example embodiments of the inventive concepts.

FIGS. 2B through 14B are sectional views taken along line A-A' of FIGS. 2A through 14A, respectively.

FIGS. 2C through 13C are sectional views taken along line B-B' of FIGS. 2A through 13A, respectively.

Figure 1A:
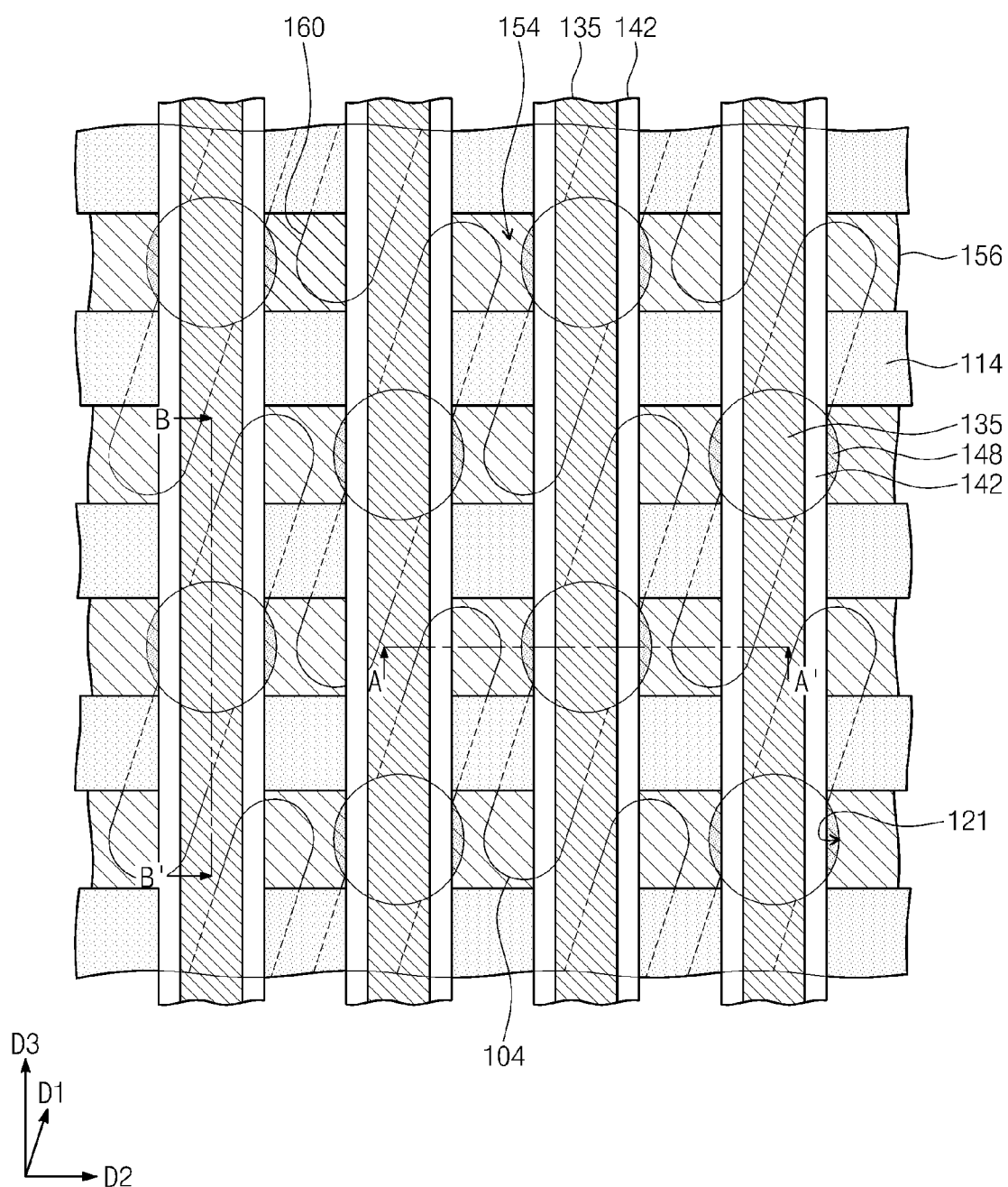
FIG. 1A is a plan view illustrating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
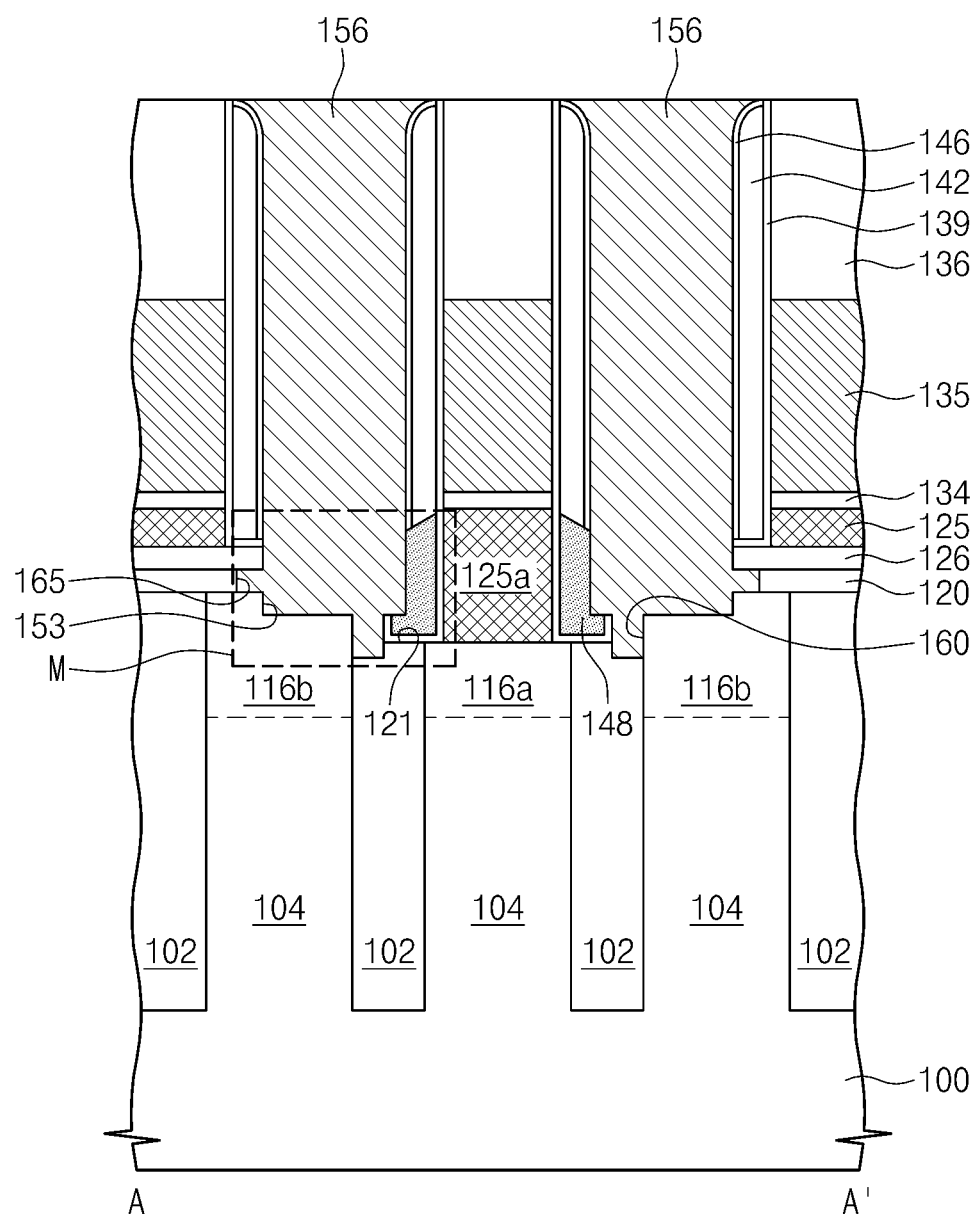
FIG. 1B is a sectional view taken along line A-A' of FIG. 1A.
Figure 1C:
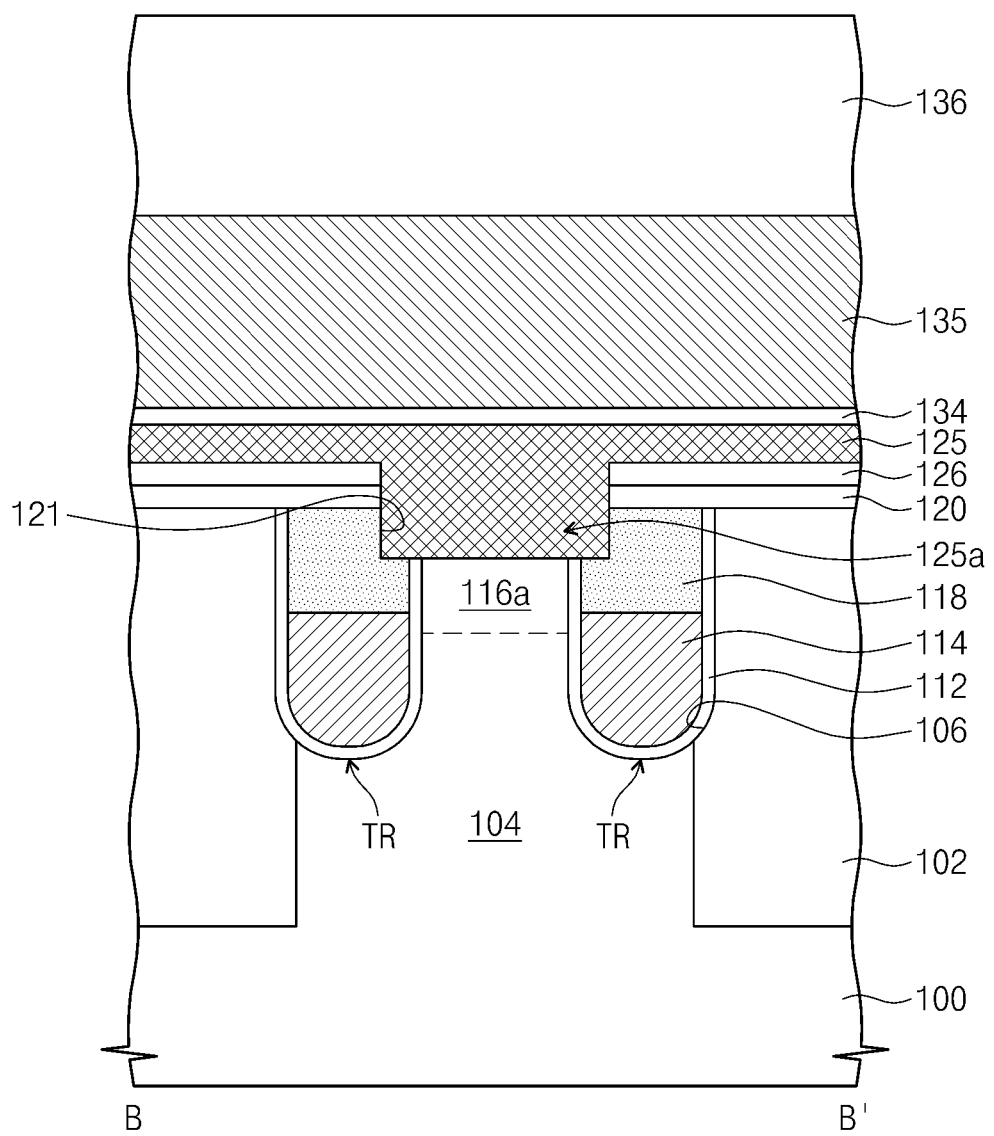
FIG. 1C is a sectional view taken along line B-B' of FIG. 1A.
Figure 1D:
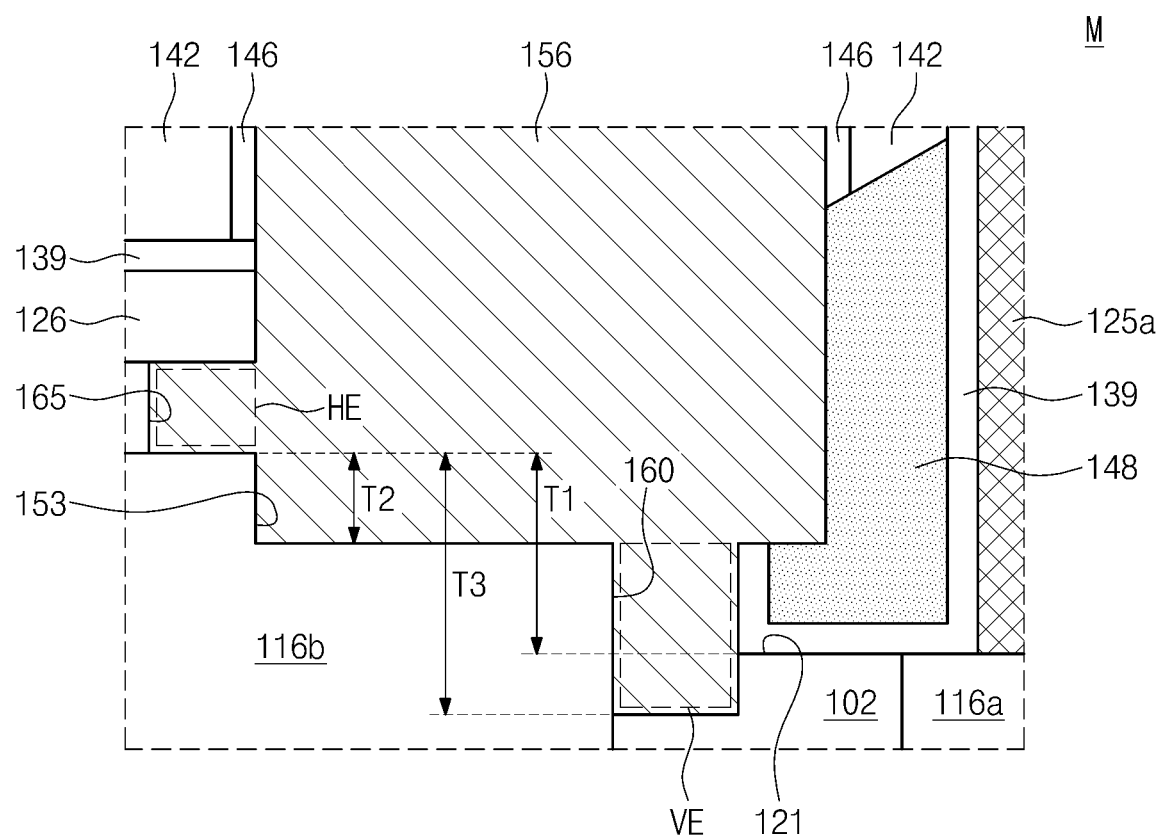
FIG. 1D is an enlarged view of a portion M of FIG. 1B.

FIG. 1A is a plan view illustrating a semiconductor device according to example embodiments of the inventive concepts. FIG. 1B is a sectional view taken along line A-A' of FIG. 1A, and FIG. 1C is a sectional view taken along line B-B' of FIG. 1A. FIG. 1D is an enlarged view of a portion M of FIG. 1B.

Referring to FIGS. 1A through 1D, a semiconductor device according to example embodiments may include transistors TR, first contacts 125a, second contacts 156, and bit lines 135, which are provided on a substrate 100.

Device isolation patterns 102 may be provided on the substrate 100 to define active patterns 104. The substrate 100 may be or include a semiconductor substrate, which is made of at least one of silicon, germanium, silicon-germanium, or semiconductor compounds. In example embodiments, the active patterns 104 may extend parallel to a top surface of the substrate 100; for example, each of the active patterns 104 may be formed to have a longitudinal axis that is parallel to a first direction D1. Further, the active patterns 104 may be disposed spaced apart from each other in the first direction D1. The active patterns 104 may be disposed spaced apart from each other in a second direction D2, which is parallel to the top surface of the substrate 100 but is different from the first direction D1. A structure and disposition of the active patterns 104 will not be limited to the example illustrated in FIG. 1A. The device isolation pattern 102 may be formed of or include silicon oxide.

The substrate 100 may be provided to have first recesses 121. According to some example embodiments, the first recesses 121 may be formed at central regions of the active patterns 104, respectively, and each of them may include at least one portion positioned on the device isolation patterns 102 adjacent to the active patterns 104. As shown in FIG. 1A, each of the first recesses 121 may have a circular shape formed at the central region of each of the active patterns 104. In certain embodiments, although not shown in the drawings, each of the first recesses 121 may have an elliptical shape elongated toward a third direction D3, which is parallel to the top surface of the substrate but is different from a direction of the longitudinal axis of the active patterns 104 (i.e., from the first direction D1). The third direction D3 may be orthogonal to the second direction D2. As shown in FIG. 1D, each of the first recesses 121 may be a recessed region having a first depth T1 from the top surface of the substrate 100. In other words, there is a difference in height between the top surface of the substrate 100 and a bottom surface of the first recess 121.

In example embodiments, a plurality of the first recesses 121 may be disposed spaced apart from each other in the second and third directions D2 and D3. For example, a pair of the first recesses 121 adjacent to each other in the second direction D2 may be spaced apart from another of the first recesses 121 in the third direction D3. The first recesses 121 may be disposed to form a zigzag arrangement.

The substrate 100 may also be provided to have second recesses 153. According to some example embodiments, the second recesses 153 may be provided at edge regions of the active patterns 104, respectively. As shown in FIG. 1D, each of the second recesses 153 may be a recessed region having a second depth T2 from the top surface of the substrate 100. Here, the second depth T2 may be smaller than the first depth T1. In example embodiments, a pair of the second recesses 153 may be provided on the both edge regions of each active pattern 104.

The substrate 100 may also be provided to have third recesses 160. Each of the third recesses 160 may be provided on the device isolation pattern 102 and between the active pattern 104 and the first recess 121; for example, see FIG. 14A. The third recess 160 may be provided adjacent to the first recess 121 and/or the second recess 153. In example embodiments, a plurality of the third recesses 160 may be formed on the substrate 100.

In example embodiments, the first, second and third recesses 121, 153, and 160 may be connected to each other, and there may be a difference in height between the first and third recesses 121 and 160 and between the third and second recesses 160 and 153.

Each of the transistors TR may include a gate insulating layer 112, a gate electrode 114, a first impurity region 116a, and a second impurity region 116b. The gate electrodes 114 may be provided in trenches 106, respectively, which are defined by the top surface of the substrate 100. The trenches 106 may extend parallel to the second direction D2. Further, the trenches 106 may be formed to have a depth that is greater than the first depth T1, when measured from the top surface of the substrate 100.

Each of the gate insulating layers 112 may be provided to cover an inner side surface of the trench 106. The gate electrode 114 may be provided to fill a lower portion of the trench 106 provided with the gate insulating layers 112. Accordingly, the gate electrode 114 may also extend parallel to the second direction D2. The gate insulating layer 112 may include a high-k dielectric material. As an example, the gate insulating layer 112 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or any combination thereof. The gate electrode 114 may be formed of or include at least one of metal nitrides (e.g., titanium nitride or tantalum nitride) and/or metallic materials (e.g., titanium, tantalum, tungsten, copper, or aluminum).

Each of the transistors TR may further include a first mask pattern 118, which is provided on the gate electrode 114 to fill an upper portion of the trench 106. The first mask pattern 118 may be formed of or include a silicon nitride layer or a silicon oxynitride layer. In example embodiments, when viewed in a plan view, the first recess 121 may be partially overlapped with the first mask pattern 118. For example, as shown in FIG. 1C, a portion of the first recess 121 may be delimited by the first mask pattern 118 adjacent to the first impurity region 116a.

The first and second impurity regions 116a and 116b may be provided in each of the active patterns 104 and at both sides of the gate electrodes 114. According to some example embodiments, when viewed in a plan view, the first impurity regions 116a may be provided at the central regions of the active patterns 104, respectively, and the second impurity regions 116b may be provided at the edge regions of the active patterns 104, respectively. Due to the presence of the first recess 121, the first impurity region 116a may have a top surface that is lower than that of the substrate 100.

Referring back to FIGS. 1A through 1C, conductive lines 125 may extend parallel to the bit lines 135 or the third direction D3, on the substrate 100. Each of the conductive lines 125 may include first contacts 125a, which may be provided on the first impurity regions 116a, respectively. For example, each of the first contacts 125a may protrude downward from the conductive line 125 and may be in contact with the first impurity region 116a through the first recess 121. As an example, the first contacts 125a may be continuously connected to the conductive line 125, and thus, the conductive line 125 may have a single comb-shaped structure. As another example, although not shown, the first contacts 125a may be provided to penetrate the conductive line 125 and be electrically connected to a corresponding one of the bit lines 135. The conductive lines 125 may be formed of or include a polysilicon layer.

When viewed in a vertical section taken parallel to the second direction D2, the first contact 125a may have a width that is smaller than a width or diameter of the first recess 121. When viewed in a vertical section taken parallel to the third direction D3, the first contact 125a may have a width that is substantially equal to that of the first recess 121.

When viewed in a vertical section taken parallel to the second direction D2, nitride patterns 148 may be provided in remaining regions of the first recesses 121, in which the first contact 125a is not provided. The nitride patterns 148 may be provided to fill the remaining regions of the first recesses 121. Each of the nitride patterns 148 may have a top surface, which is substantially lower than that of the conductive line 125 and/or the first contact 125a and is at an angle to the top surface of the conductive line 125. For example, the nitride patterns 148 may have a height or thickness decreasing in a direction away from the first contact 125a.

A plurality of the conductive lines 125 may be provided on the substrate 100, and each of the conductive lines 125 may include a plurality of the first contacts 125a which are provided in the first recesses 121, respectively. Accordingly, the first contacts 125a may have substantially the same disposition structure as that of the first recesses 121. For example, the first contacts 125a may be disposed spaced apart from each other in the second and third directions D2 and D3. In other words, the first contacts 125a may be disposed to form a zigzag arrangement.

Referring back to FIGS. 1B and 1C, a first interlayered insulating pattern 120 and a second interlayered insulating pattern 126 may be sequentially stacked between the substrate 100 and the bit line 135. As an example, the first and second interlayered insulating patterns 120 and 126 may be sequentially stacked between the substrate 100 and the conductive line 125. Here, the first and second interlayered insulating patterns 120 and 126 may be formed to define openings overlapped with the first, second, and third recesses 121, 153, and 160, when viewed in a plan view. In other words, the first and second interlayered insulating patterns 120 and 126 may not be provided on the first, second, and third recesses 121, 153, and 160. The first interlayered insulating pattern 120 may be formed of or include a silicon oxide layer, and the second interlayered insulating pattern 126 may be formed of or include a silicon nitride layer.

Figure 14A:
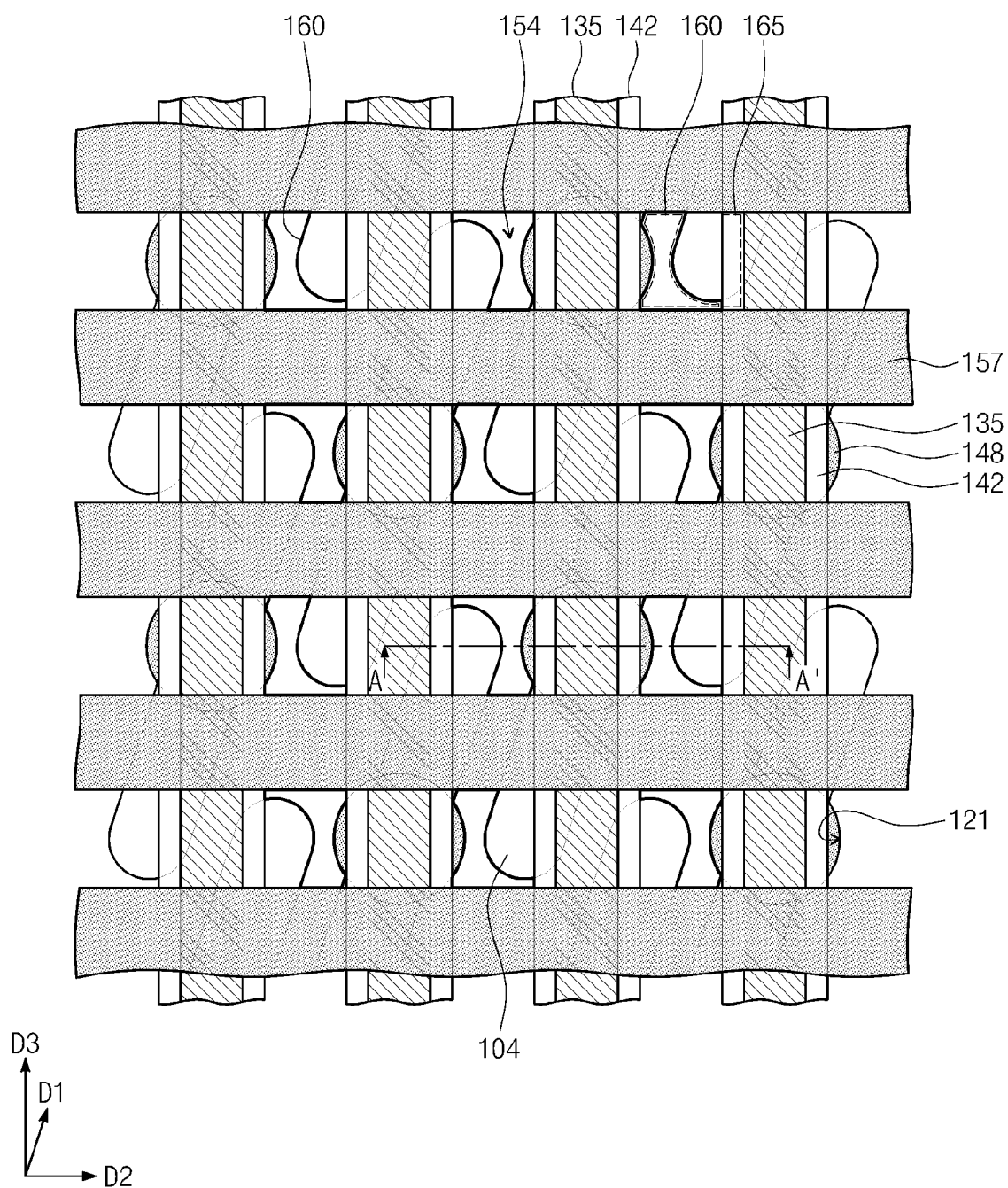

The first interlayered insulating pattern 120 may be provided to define dent regions 165, each of which is horizontally extended from the second recess 153 toward the bit line. The dent region 165 may be connected to the second recess 153 adjacent thereto. Since the dent regions are defined by a side surface of the first interlayered insulating pattern 120, there may be a difference in height between the dent region 165 and the second recess 153. For example, the side surface of the first interlayered insulating pattern 120 defining the dent region 165 may not be aligned to that of the second interlayered insulating pattern 126. When viewed in plan view, the dent region 165 may be overlapped with first to third spacers 139, 142, and 146, as shown in FIG. 14A.

The conductive lines 125 may be electrically connected to the bit lines 135, respectively. The bit lines 135 may extend parallel to the third direction D3. The bit lines 135 may include at least one of metals and/or metal nitrides (for example, tungsten, tungsten nitride, or titanium nitride). As an example, in the case where the conductive line 125 includes a polysilicon layer and the bit line 135 includes a metal layer, a metal barrier pattern 134 may be further provided between the conductive line 125 and the bit line 135. The metal barrier pattern 134 may be formed of or include a conductive metal nitride (e.g., titanium nitride, tantalum nitride, and/or tungsten nitride).

The semiconductor device may further include second mask patterns 136 provided on the bit lines 135, respectively. The second mask patterns 136 may extend parallel to the bit lines 135 or the third direction D3. When viewed in a vertical section taken parallel to the second direction D2, the first contact 125a, the metal barrier pattern 134, the bit line 135, and the second mask pattern 136 may have substantially the same width. The second mask pattern 136 may include a silicon nitride layer or a silicon oxynitride layer.

First spacers 139 may be provided to cover side surfaces of bit line stacks, each of which includes the first contact 125a, the metal barrier pattern 134, the bit line 135, and the second mask pattern 136. Each of the first spacers 139 may be extended to cover top surfaces of the first impurity region 116a and the device isolation pattern 102 and enclose a lower portion of the nitride pattern 148. Each of the first spacer 139 may be extended to cover a portion of a top surface of the second interlayered insulating pattern 126. Further, a second spacer 142 and a third spacer 146 may be provided on the side surface of each bit line stack to sequentially cover each of the first spacers 139. The second spacer 142 may be interposed between the first spacer 139 and the third spacer 146. The first to third spacers 139, 142, and 146 may extend parallel to the bit line 135 or the third direction D3. The first spacer 139 and the third spacer 146 may be formed of or include a silicon nitride layer. The second spacer 142 may be formed of or include a silicon oxide layer.

The second contacts 156 may be disposed to be in contact with the second impurity regions 116b, respectively. Each of the second contacts 156 may be provided between adjacent ones of the bit lines 135 but may be electrically separated from the bit lines 135 by the first to third spacers 139, 142, and 146, which are provided on the side surfaces of the bit line stacks. Further, the second contacts 156 may be electrically separated from the first impurity regions 116a by the nitride patterns 148. Although not shown, capacitors (not shown) may be provided on and electrically connected to the second contacts 156, respectively. The second contacts 156 may be formed of or include at least one of metals or metal nitrides (for example, tungsten, tungsten nitride, or titanium nitride).

Referring to FIG. 1D, each of the second contacts 156 may include a vertically-extended portion VE and a horizontally-extended portion HE, which are provided on a lower portion thereof. The vertically-extended portion VE may fill the third recess 160. For example, the vertically-extended portion VE may be inserted into an upper portion of the device isolation pattern 102 or toward a bottom surface of the substrate, between the second impurity region 116b and the first impurity region 116a. In other words, the vertically-extended portion VE may cover an upper side surface of the second impurity region 116b. The vertically-extended portion VE may have a bottom surface that is lower than those of the first and second recesses 121 and 153. The vertically-extended portion VE may be horizontally spaced apart from the first contact 125a and the first impurity region 116a, and the nitride pattern 148 may be interposed therebetween. Accordingly, the vertically-extended portion VE may be electrically separated from the first contact 125a and the first impurity region 116a.

The horizontally-extended portion HE may fill the dent region 165. For example, the horizontally-extended portion HE may cover a portion of the top surface of the second impurity region 116b defining a bottom surface of the dent region 165. A portion of the top surface of the second impurity region 116b may be coplanar with the top surface of the substrate 100. When viewed in plan view, the horizontally-extended portion HE may be overlapped with the first to third spacers 139, 142, and 146. The horizontally-extended portion HE may be spaced apart from the conductive line 125 and the bit line 135 by the second interlayered insulating pattern 126 and the first to third spacers 139, 142, and 146 interposed therebetween. Accordingly, the horizontally-extended portion HE may be electrically separated from the conductive line 125 and the bit line 135.

According to some example embodiments, the second contact 156 may include the vertically-extended portion VE and the horizontally-extended portion HE, and thus, the second contact 156 can be connected to the second impurity region 116b with an increased contact area. In other words, the second contact 156 can be electrically connected to the second impurity region 116b through the bottom surfaces of the second recess 153 and the dent region 165 and the side surface of the third recess 160. Such an increase in contact area between the second contact 156 and the second impurity region 116b makes it possible to prevent or inhibit highly-integrated semiconductor devices from suffering from an increase in electric resistance thereof. Further, it is possible to prevent or inhibit the second contact 156 from being misaligned to and thereby being electrically disconnected from the second impurity region 116b by a reduced process margin.

FIGS. 2A through 14A are plan views illustrating a method of fabricating a semiconductor device according to example embodiments of the inventive concepts. FIGS. 2B through 14B are sectional views taken along line A-A' of FIGS. 2A through 14A, respectively, and FIGS. 2C through 13C are sectional views taken along line B-B' of FIGS. 2A through 13A, respectively.

Figure 2A:
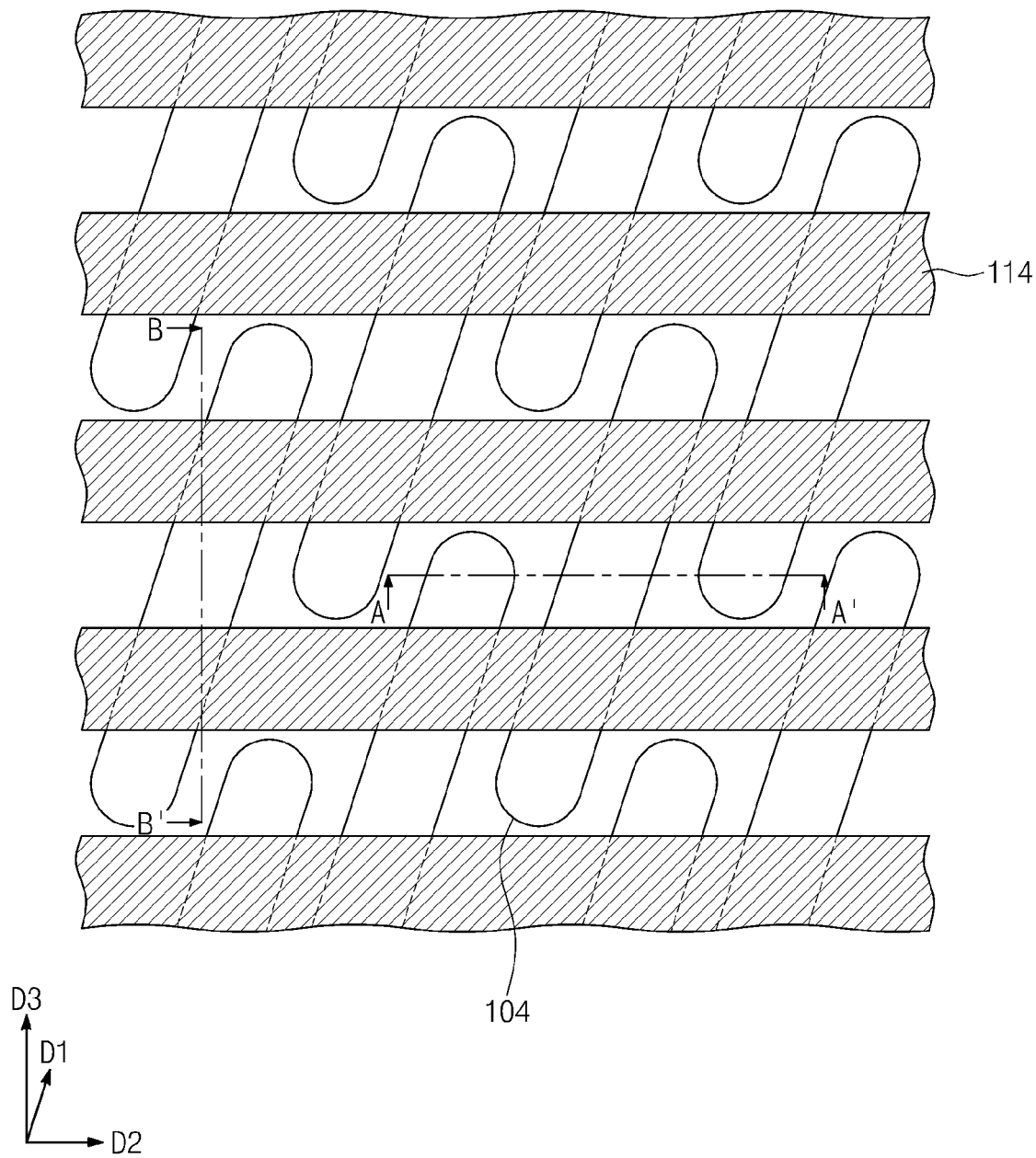
Figure 2B:
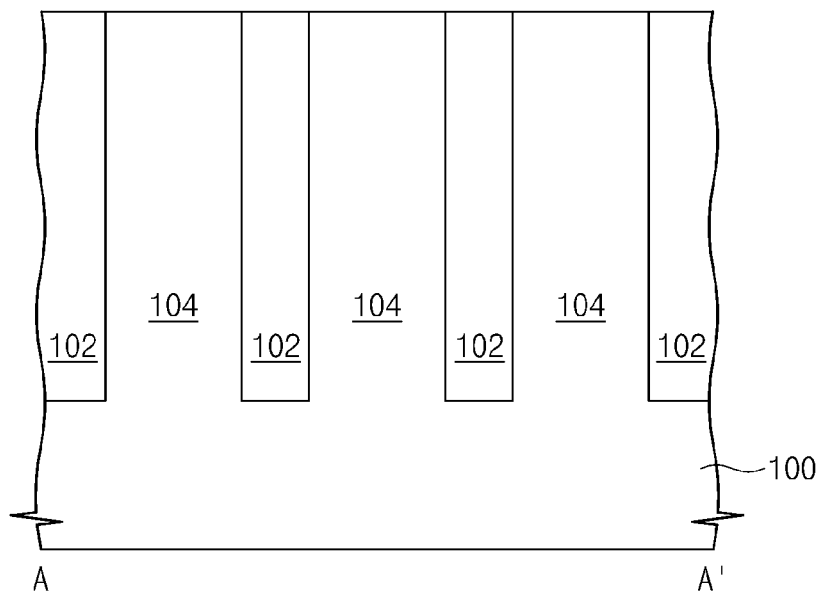
Figure 2C:
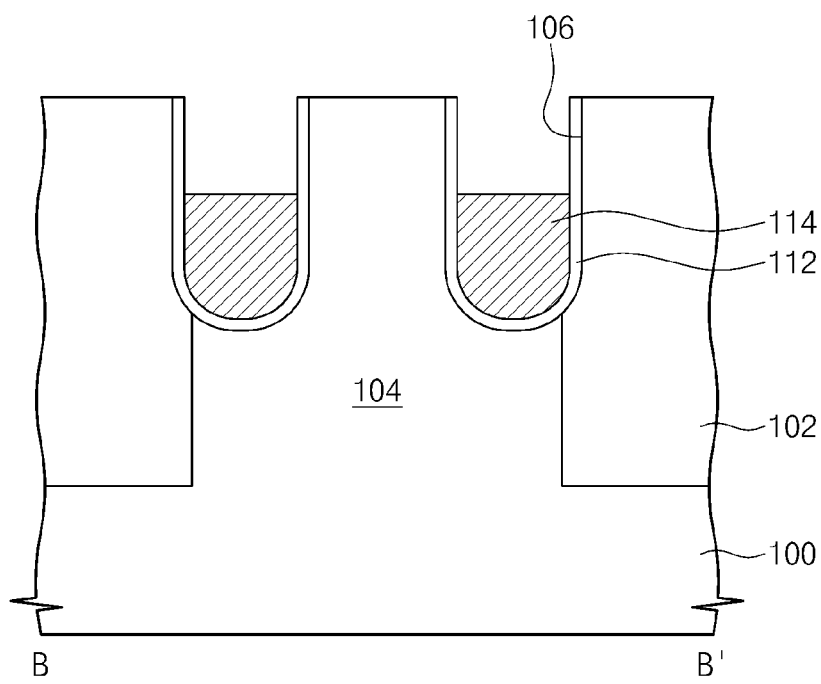

Referring to FIGS. 2A through 2C, the device isolation patterns 102 may be formed on the substrate 100 to define the active patterns 104, and then, the gate insulating layers 112 and the gate electrodes 114 may be formed on the substrate 100 with the device isolation patterns 102.

For example, the formation of the device isolation patterns 102 may include etching the substrate 100 and filling the etched regions with an insulating material. The device isolation patterns 102 may be formed of or include silicon oxide. Each of the device isolation patterns 102 may be formed to have a multi-layered structure. The active patterns 104 defined by the device isolation patterns 102 may be formed to have a longitudinal direction parallel to the top surface of the substrate 100 or the first direction D1.

The trenches 106 may be formed on the substrate 100 provided with the device isolation patterns 102 and the active patterns 104. The trenches 106 may be formed to extend parallel to the top surface of the substrate 100 (for example, parallel to the second direction D2 at an angle to the first direction D1).

The gate insulating layers 112 may be formed on the inner side surfaces of the trenches 106, respectively. Here, the gate insulating layers 112 may be formed to conformally cover the trenches 106, respectively. The gate electrodes 114 may be formed to fill lower portions of the trenches 106 covered with the gate insulating layers 112. The formation of the gate electrode 114 may include forming a conductive layer to fill the trenches 106 and removing the conductive layer from upper portions of the trenches 106.

The gate insulating layer 112 may include a high-k dielectric material. As an example, the gate insulating layer 112 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or any combination thereof. The gate electrode 114 may be formed of or include at least one of metal nitrides (e.g., titanium nitride or tantalum nitride) and/or metallic materials (e.g., titanium, tantalum, tungsten, copper, or aluminum).

Figure 3A:
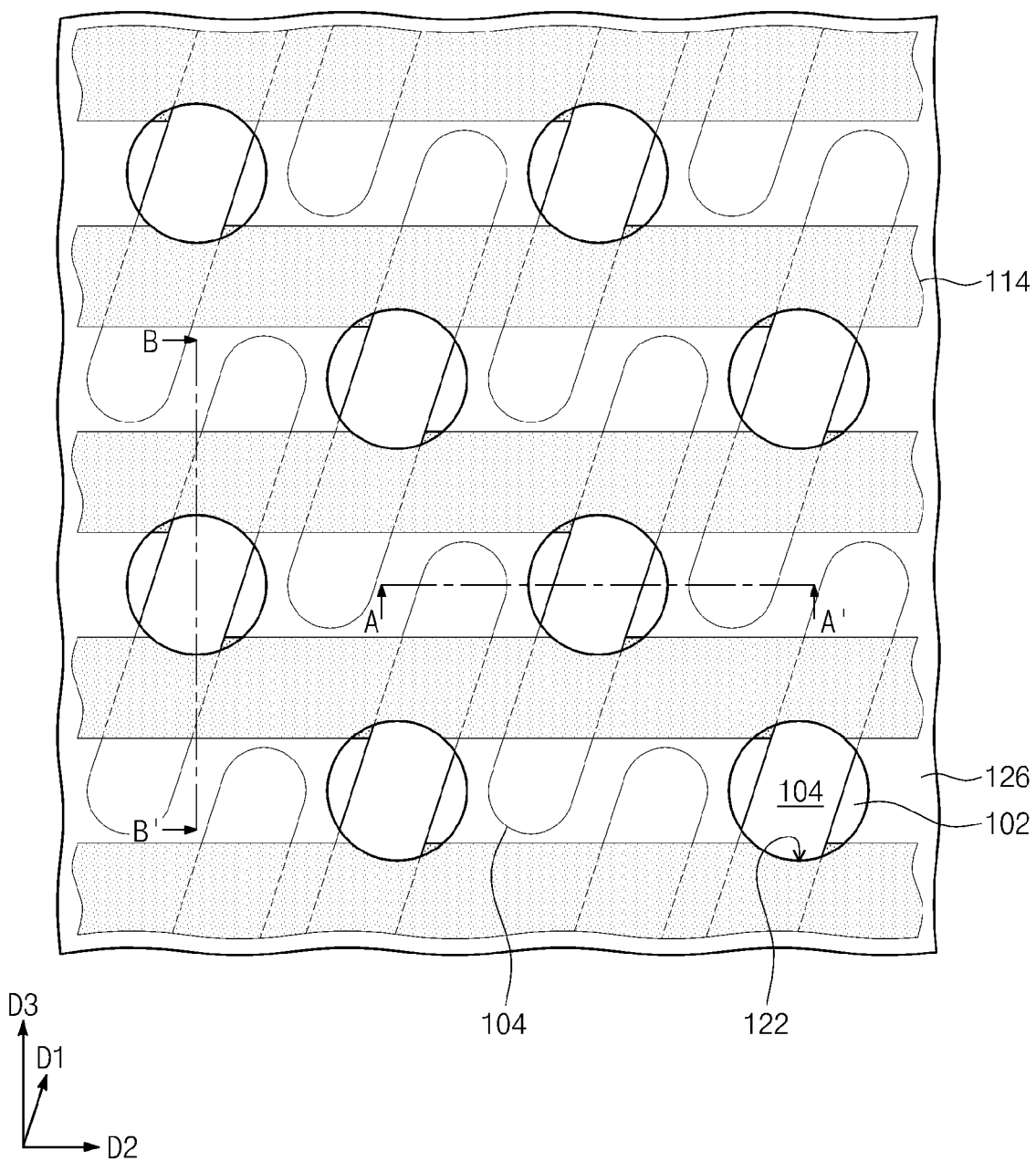
Figure 3B:
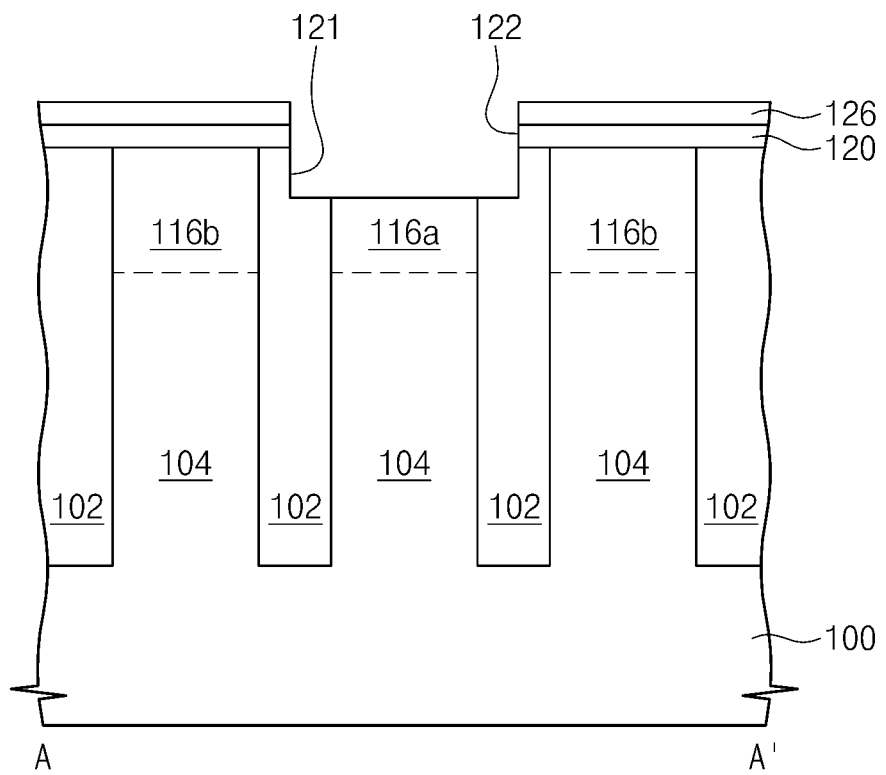
Figure 3C:
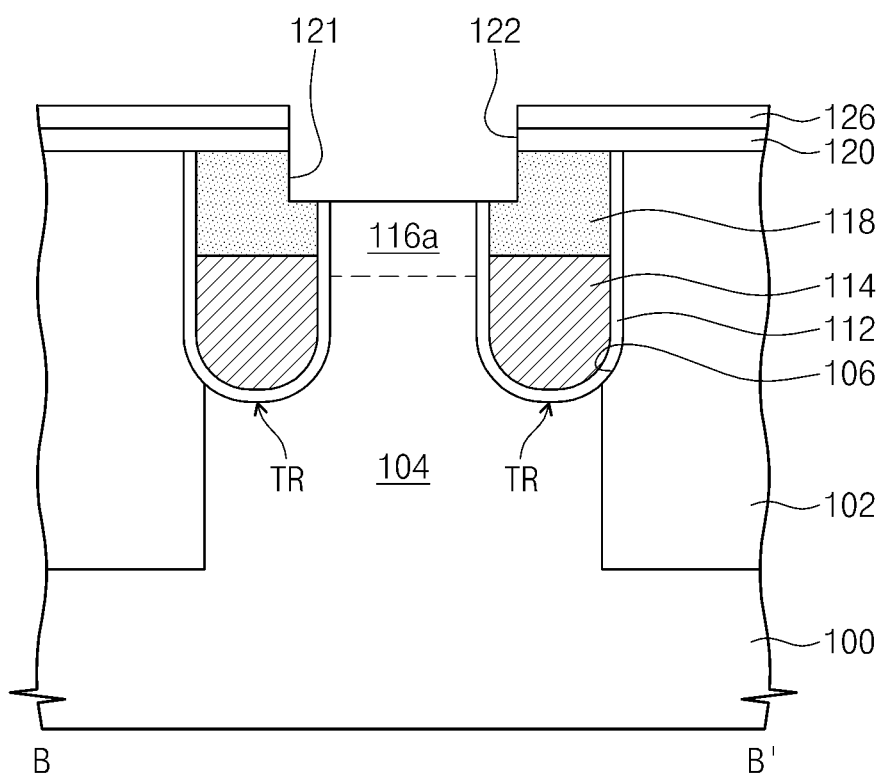

Referring to FIGS. 3A through 3C, the first mask patterns 118 may be formed to fill the upper portions of the trenches 106. The first mask patterns 118 may be formed of or include a silicon nitride layer or a silicon oxynitride layer. Thereafter, the first impurity regions 116a and the second impurity regions 116b may be formed by injecting impurities into the active patterns 104 using the first mask patterns 118 as an ion mask. The first and second impurity regions 116a and 116b may be formed in such a way that bottom surfaces thereof are positioned adjacent to the gate electrode 114. The gate insulating layer 112, the gate electrode 114, the first mask pattern 118, and the first and second impurity regions 116a and 116b may constitute the transistor TR. In example embodiments, the transistors TR may be buried channel array transistors, whose channel regions are positioned in the substrate 100.

A first interlayered insulating layer (not shown) and a second interlayered insulating layer (not shown) may be sequentially stacked on the substrate 100, on which the transistors TR are provided. The first interlayered insulating layer may be formed of or include a silicon oxide layer, and the second interlayered insulating layer may be formed of or include a silicon nitride layer. The first and second interlayered insulating layers may be etched to form first and second interlayered insulating patterns 120 and 126. The first and second interlayered insulating patterns 120 and 126 may be formed to define first contact holes 122 exposing the first impurity regions 116a, respectively. The first contact holes 122 may be formed to expose not only the first impurity regions 116a but also portions of the device isolation patterns 102 and the first mask patterns 118 adjacent to the first impurity regions 116a.

According to some example embodiments, during the etching of the first and second interlayered insulating layers, the top surfaces of the first impurity regions 116a, the device isolation pattern 102, and the first mask patterns 118 may be over-etched to form the first recesses 121. The first recesses 121 may be continuously extended from the first contact holes 122. The first recesses 121 and the first contact holes 122 may be formed in such a way that bottom surfaces thereof are positioned at a level lower than the top surface of the substrate 100. As shown in FIG. 3A, the first recesses 121 may be positioned at central regions of the active patterns 104, respectively, and each of them may have a circular shape. In certain embodiments, although not shown in the drawings, each of the first recesses 121 may have an elliptical shape elongated toward the third direction D3, which is parallel to the top surface of the substrate but is different from a direction of the longitudinal axis of the active patterns 104 (i.e., from the first direction D1). Here, the third direction D3 may be orthogonal to the second direction D2.

Figure 4A:
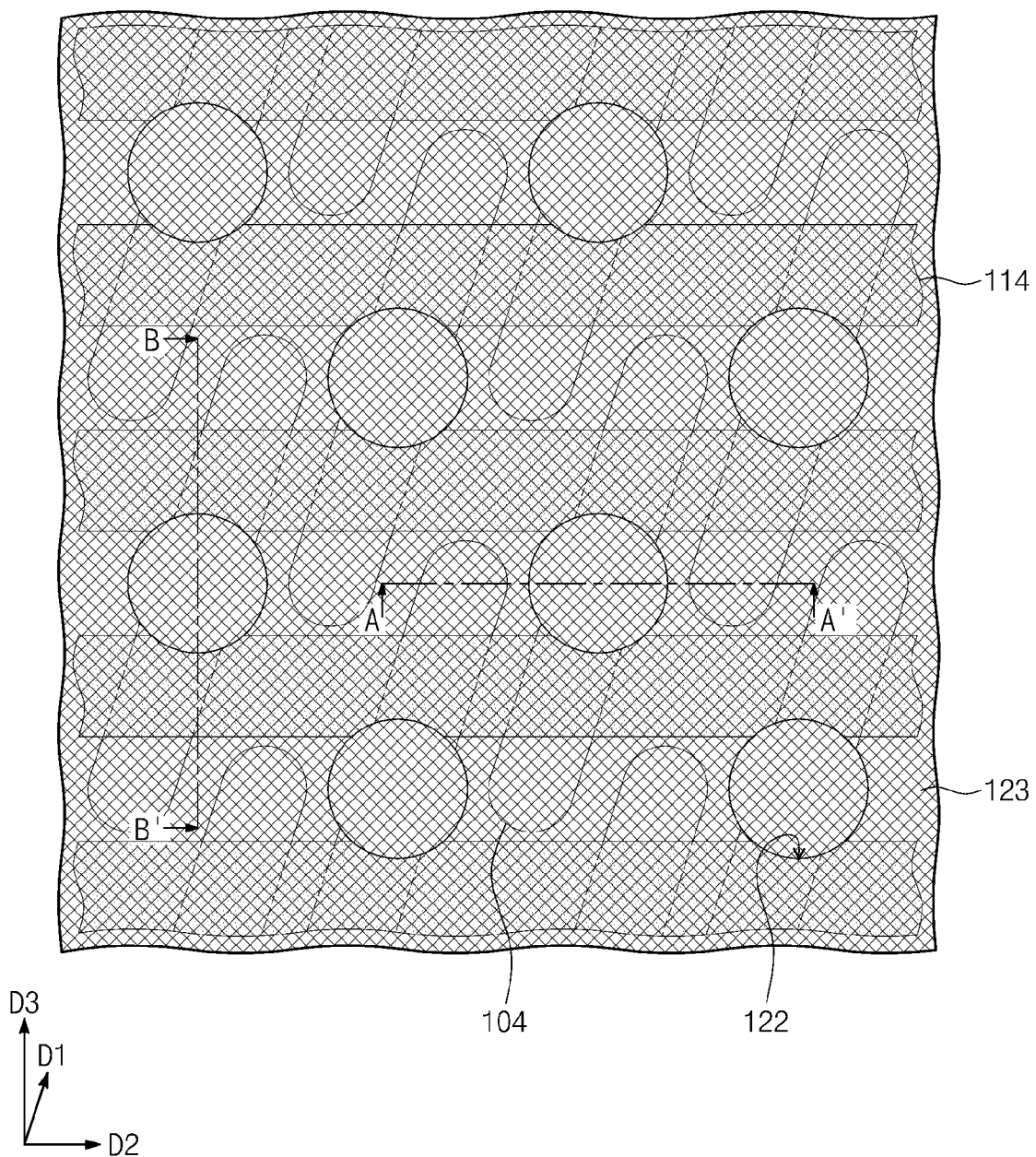
Figure 4B:
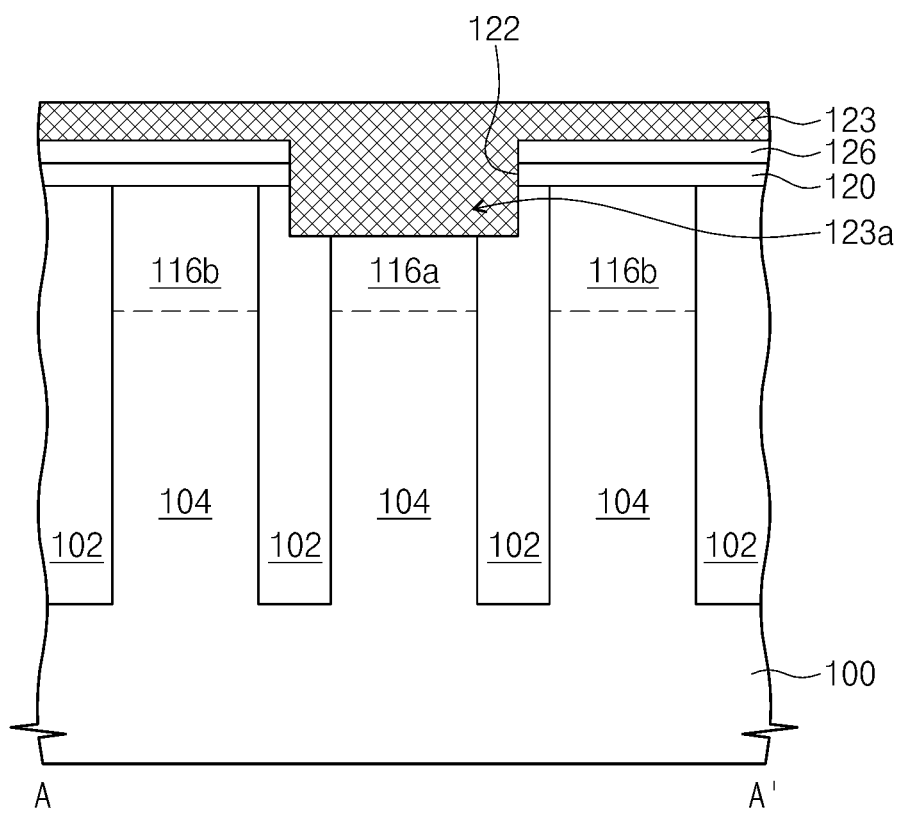
Figure 4C:
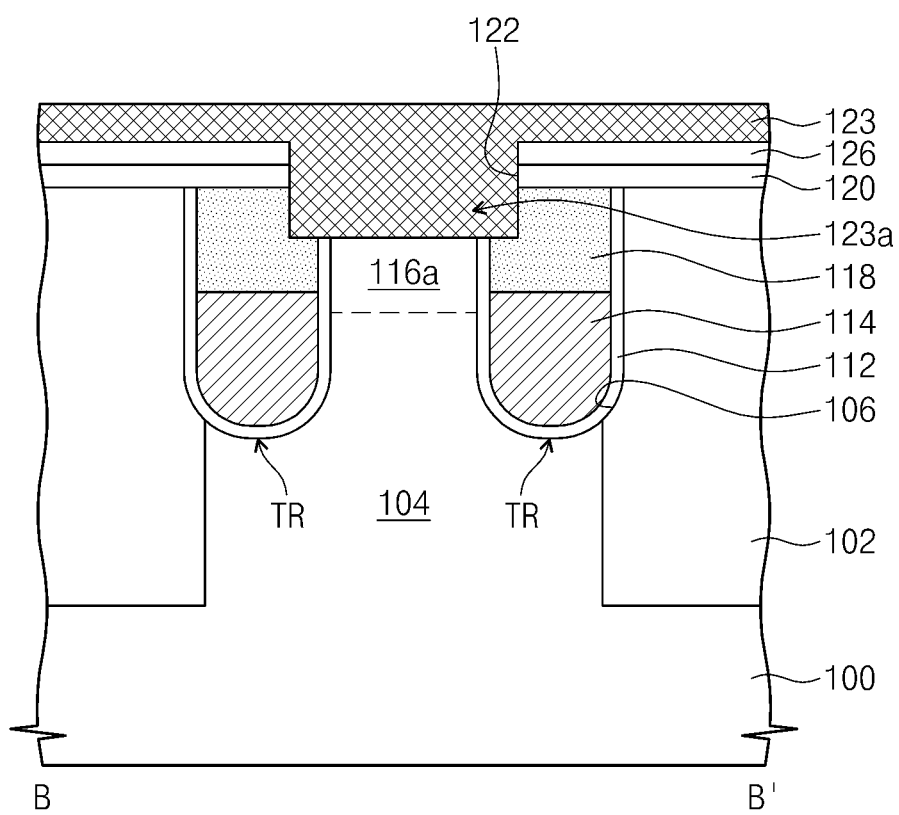

Referring to FIGS. 4A through 4C, a preliminary first contact layer 123 may be formed to fill the first contact holes 122 and the first recesses 121. The preliminary first contact layer 123 may be formed to cover the entire top surface of the substrate 100. The preliminary first contact layer 123 may include protrusions 123a, which are formed in the first contact holes 122 and the first recesses 121. In other words, when viewed in plan view, the protrusions 123a may be formed at positions corresponding to the first recesses 121. Each of the protrusions 123a may be electrically connected to a corresponding one of the first impurity regions 116a through the first and second interlayered insulating patterns 120 and 126. The preliminary first contact layer 123 may be formed of or include a conductive layer (e.g., a polysilicon layer).

Figure 5A:
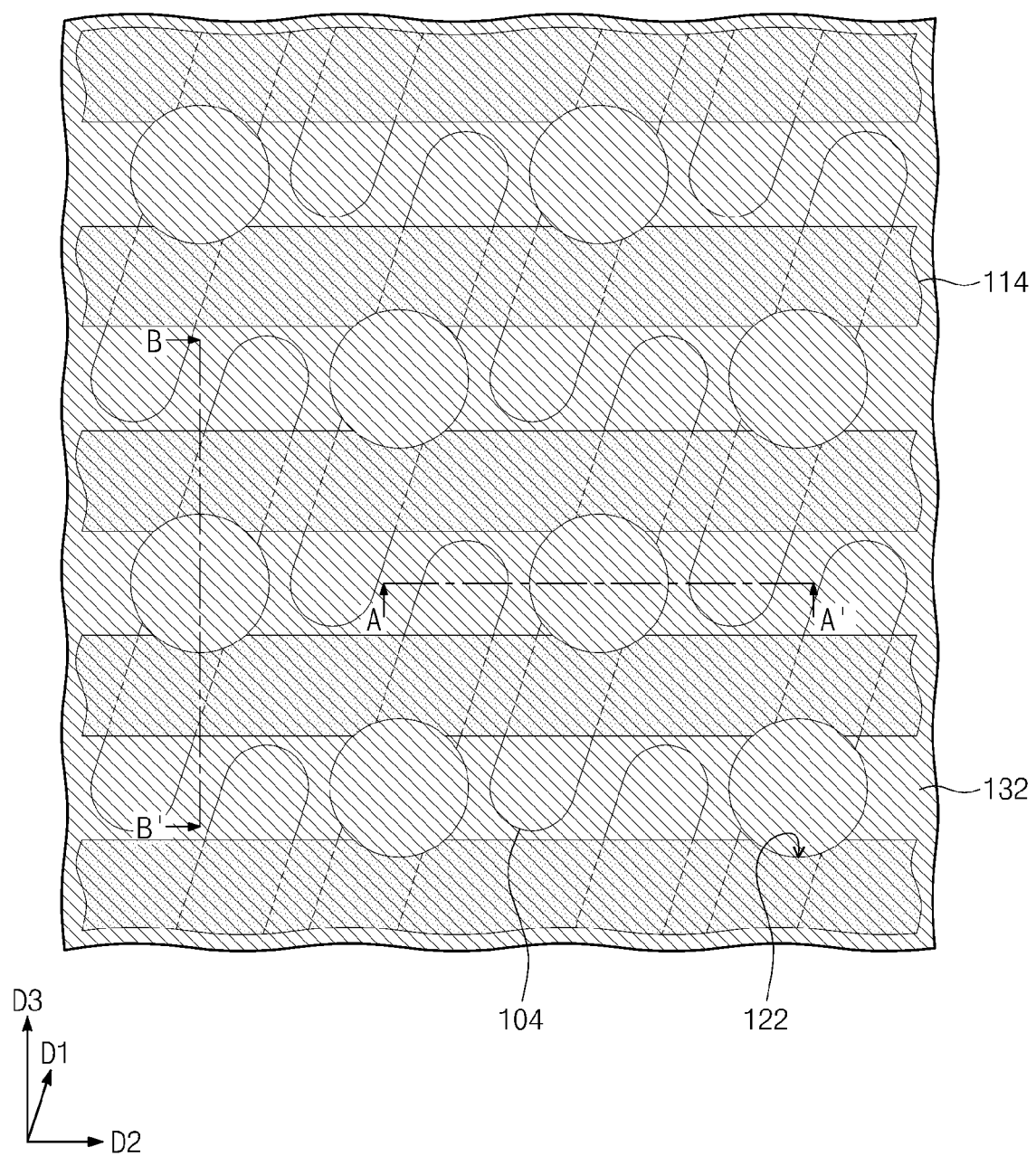
Figure 5B:
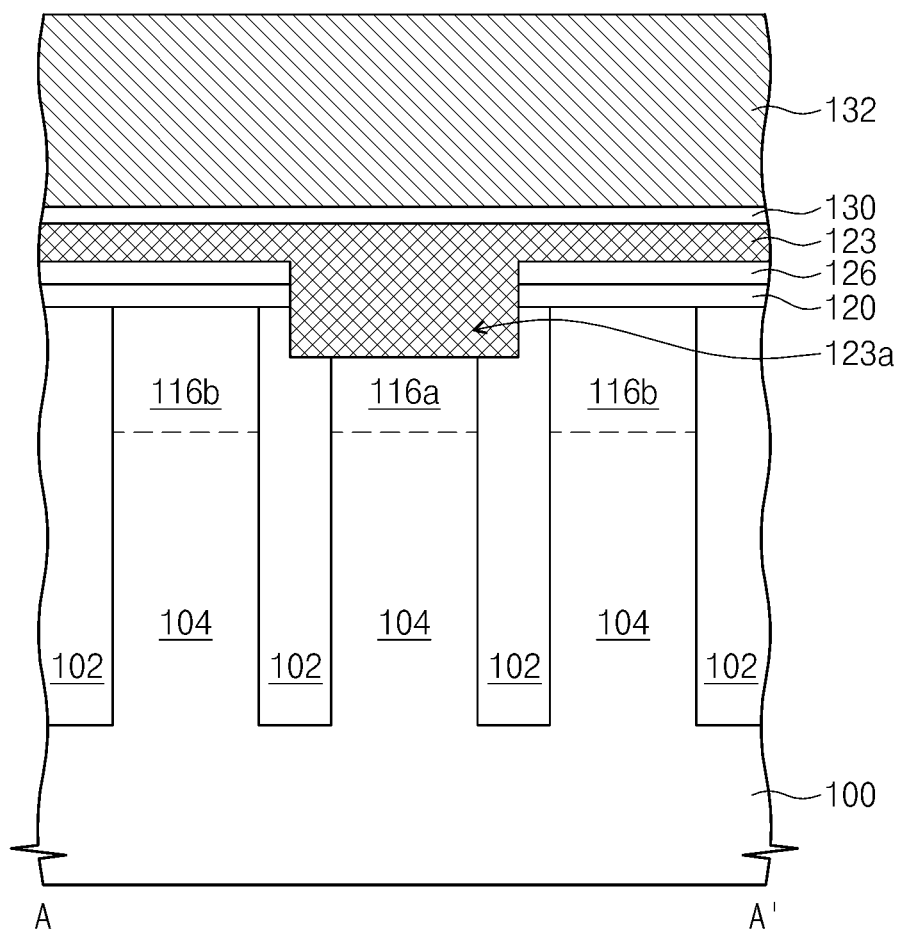
Figure 5C:
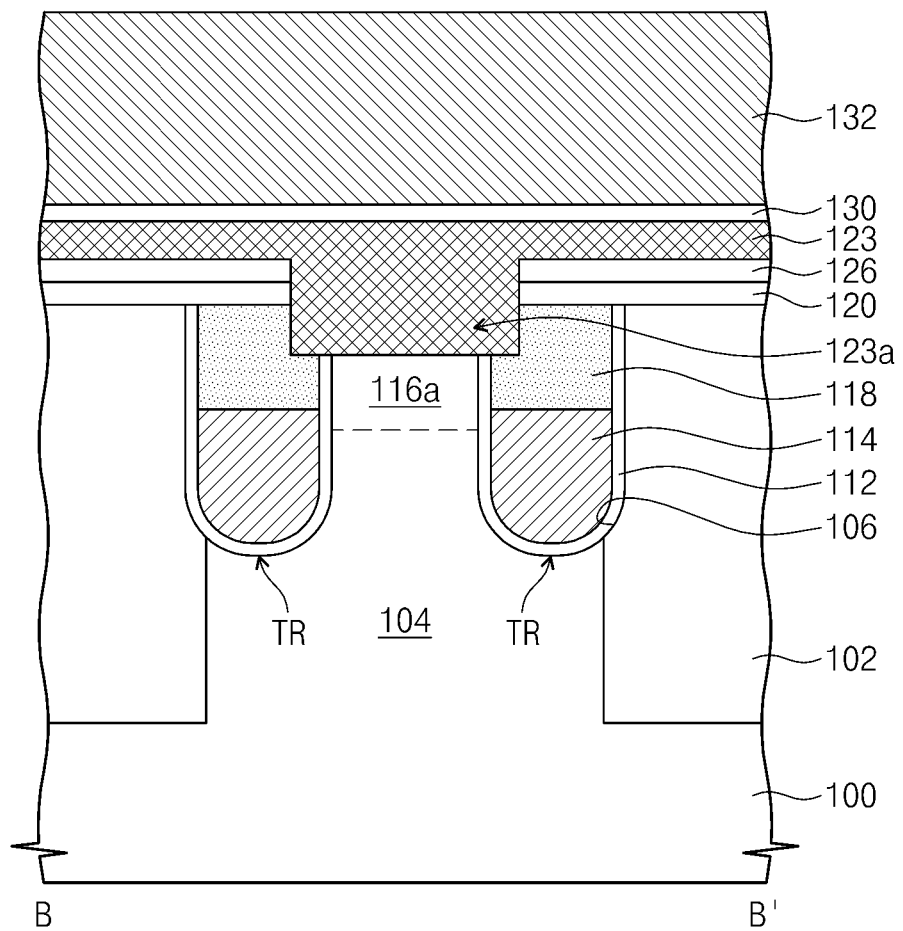

Referring to FIGS. 5A through 5C, a metal barrier layer 130 and a conductive layer 132 may be formed on the preliminary first contact layer 123. The metal barrier layer 130 may be formed of or include at least one of conductive metal nitrides (e.g., titanium nitride, tantalum nitride, and/or tungsten nitride). The conductive layer 132 may be formed of or include at least one of metals or metal nitrides (e.g., tungsten, tungsten nitride, or titanium nitride). The metal barrier layer 130 may contribute to prevent or inhibit metallic elements in the conductive layer 132 from being diffused into the preliminary first contact layer 123.

Figure 6A:
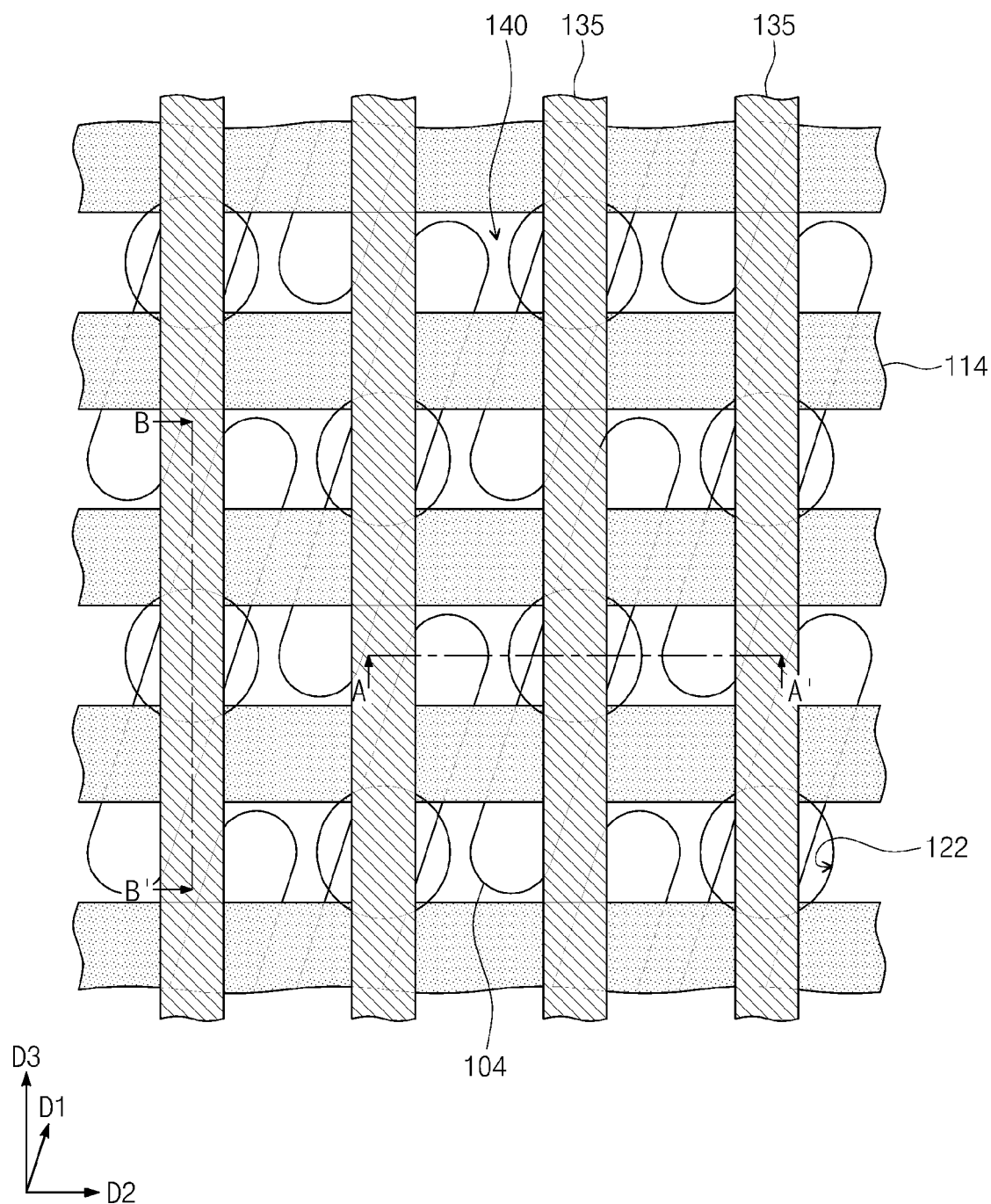
Figure 6B:
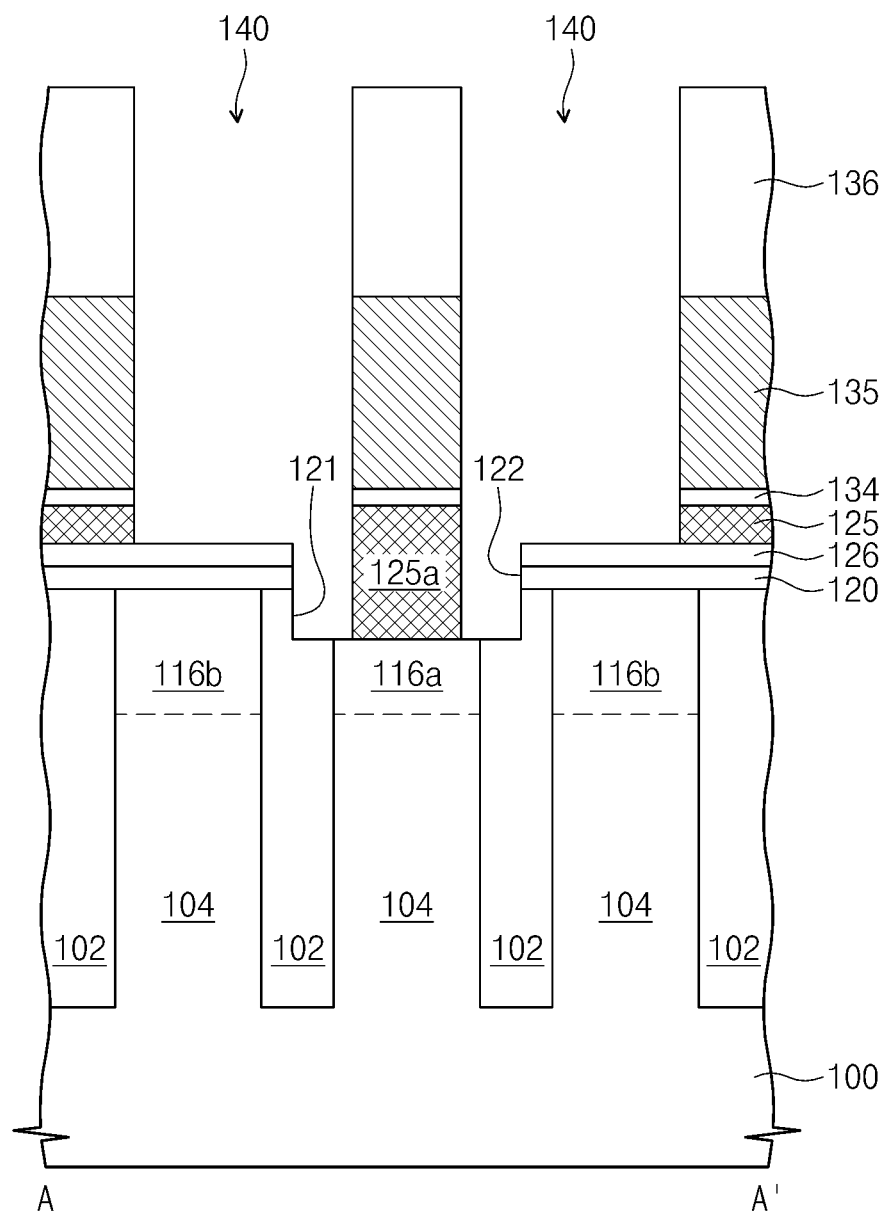
Figure 6C:
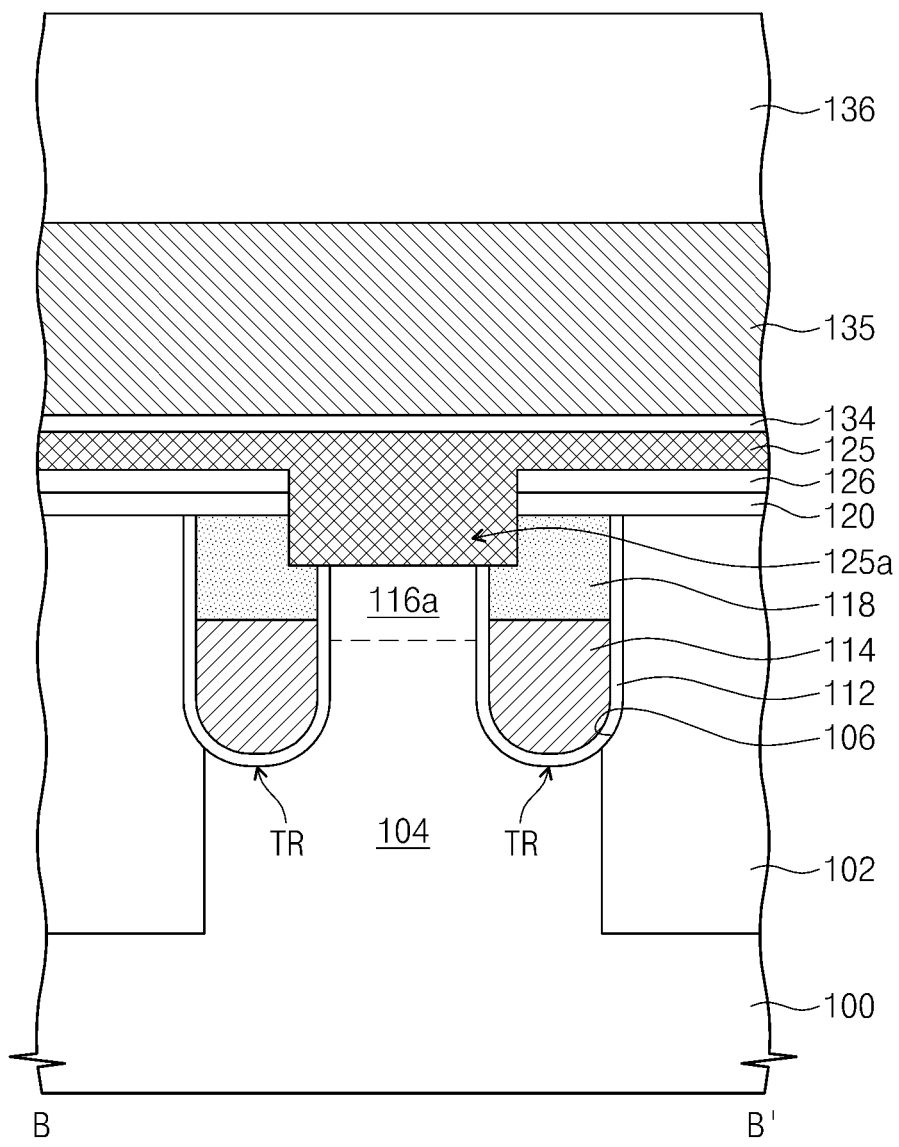

Referring to FIGS. 6A through 6C, the second mask patterns 136 may be formed on the conductive layer 132, and then, the conductive layer 132, the metal barrier layer 130, and the preliminary first contact layer 123 may be etched using the second mask patterns 136 as an etch mask. In detail, a first mask layer (not shown) may be formed on the conductive layer 132. The first mask layer may include a silicon nitride layer or a silicon oxynitride layer. The first mask layer may be patterned to form the second mask patterns 136 on the conductive layer 132. Each of the second mask patterns 136 may be a line-shaped structure extending parallel to the third direction D3. Further, the second mask patterns 136 may be formed spaced apart from each other in the second direction D2.

The conductive layer 132, the metal barrier layer 130, and the preliminary first contact layer 123 may be sequentially etched using the second mask patterns 136 as an etch mask. In example embodiments, due to the presence of the second interlayered insulating pattern 126, the first interlayered insulating pattern 120 may be not etched in the etching process. As a result of the etching process, the bit lines 135, the metal barrier patterns 134, and the conductive lines 125 may be formed. When viewed in plan view, the bit lines 135, the metal barrier patterns 134, and the conductive lines 125 may be formed to have an arrangement and positions corresponding to those of the second mask patterns 136.

The conductive line 125, the metal barrier pattern 134, the bit line 135, and the second mask pattern 136 may constitute bit line stacks defining first openings 140 therebetween. The first openings 140 may extend parallel to the third direction D3.

The bit line 135 may be electrically connected to the first impurity region 116a via the conductive line 125. According to some example embodiments, each of the conductive lines 125 may be a line-shaped structure extending parallel to the bit line 135 or the third direction D3. Here, each of the conductive lines 125 may include a plurality of the first contacts 125a, which are connected to the first impurity regions 116a, respectively. In other words, the first contacts 125a may be continuously connected to the conductive line 125, and thus, the conductive line 125 may have a single comb-shaped structure. As another example, although not shown, the first contacts 125a may be provided to penetrate the conductive line 125 and be electrically connected to a corresponding one of the bit lines 135.

When viewed in a vertical section taken parallel to the second direction D2, the bit line 135 and the first contact 125a may be formed to have substantially the same width.

As a result of the formation of the conductive lines 125, portions of the preliminary first contact layer 123 may be removed from the first recesses 121, and thus, the first recesses 121 may be opened again. In other words, the first recesses 121 may be formed to partially expose the first impurity region 116a and the device isolation pattern 102. The first recesses 121 may be continuously connected to the first openings 140.

Figure 7A:
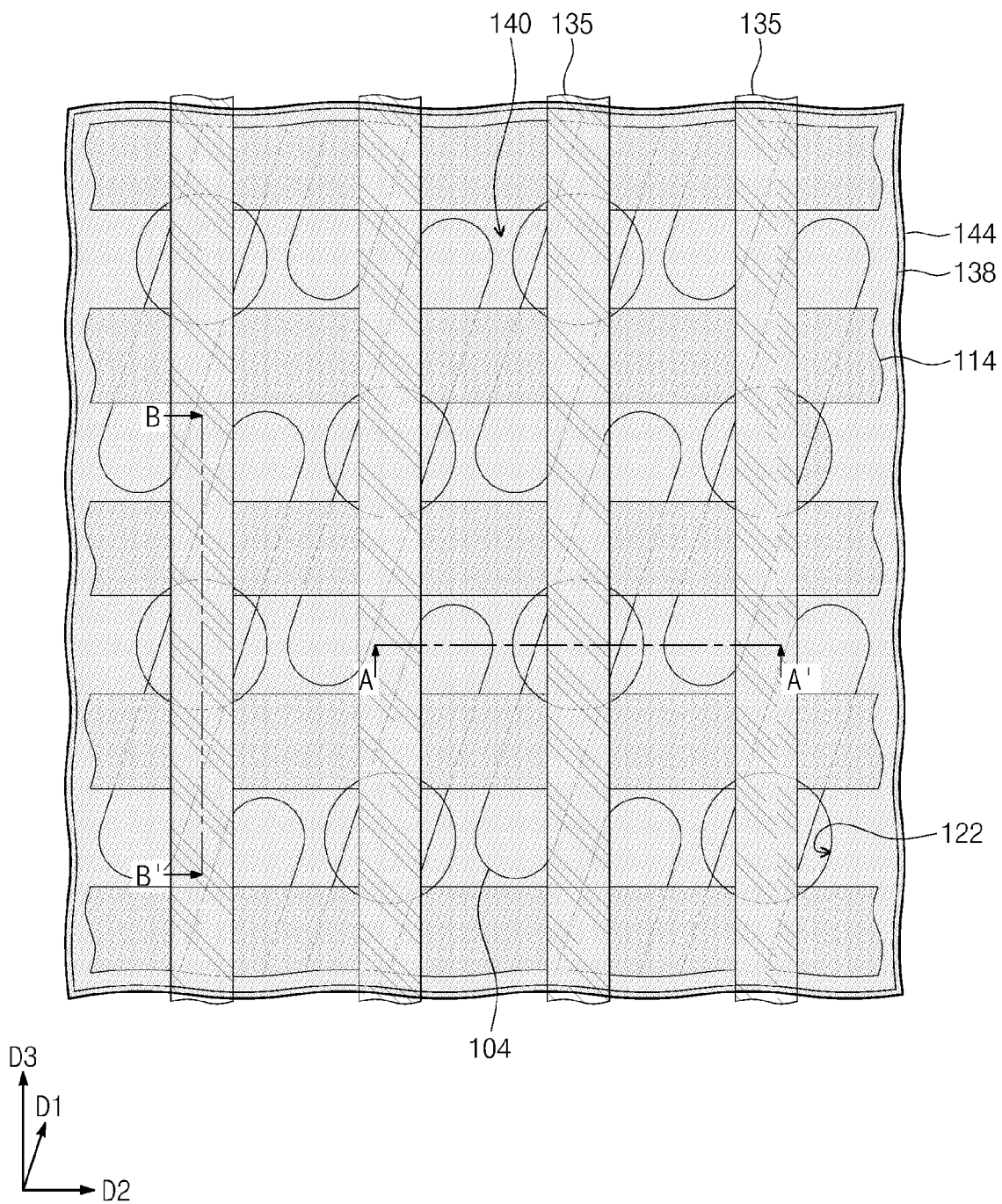
Figure 7B:
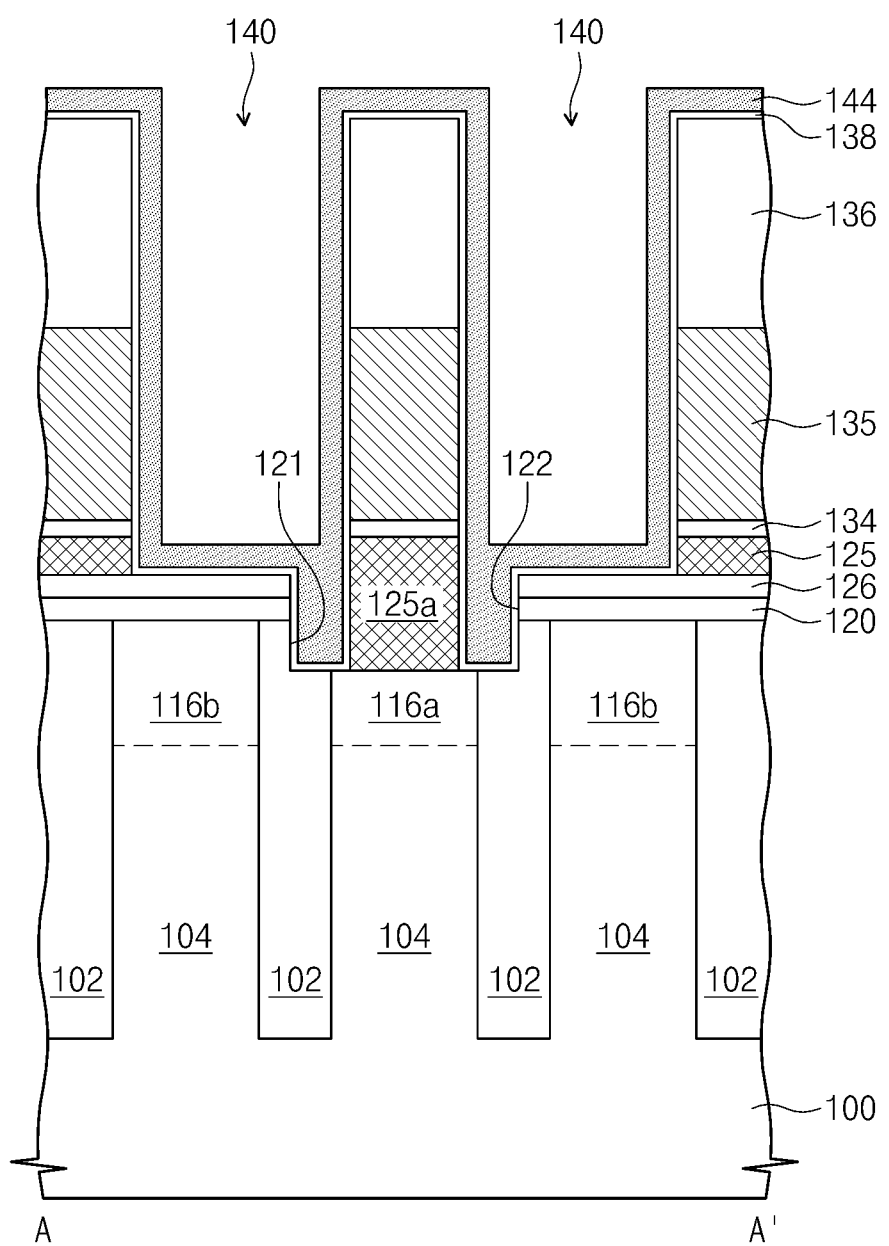
Figure 7C:
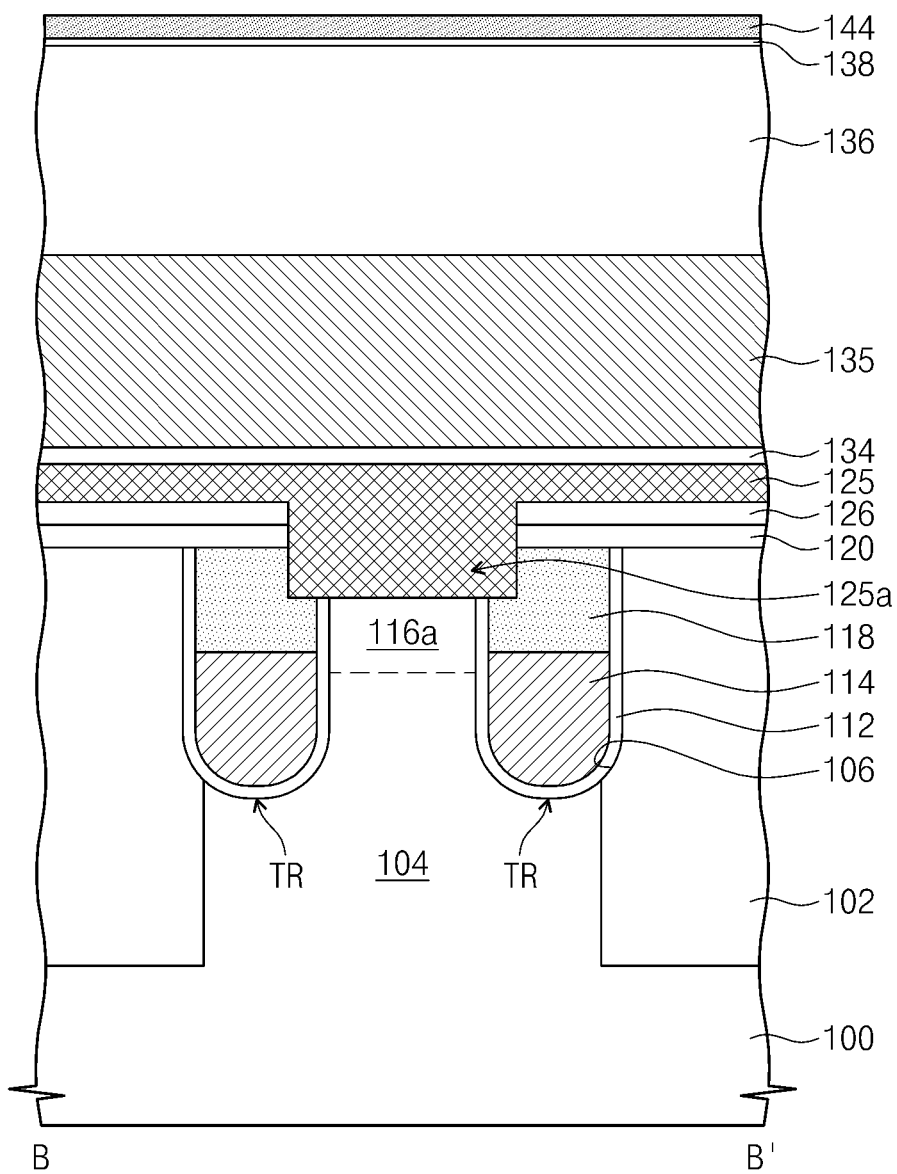

Referring to FIGS. 7A through 7C, a first spacer layer 138 and a nitride layer 144 may be sequentially formed to conformally cover the resulting structure with the first openings 140. The first spacer layer 138 and the nitride layer 144 may be formed to wholly cover the bit line stacks, each of which includes the conductive line 125, the metal barrier pattern 134, the bit line 135, and the second mask pattern 136. Further, the first spacer layer 138 and the nitride layer 144 may be formed to cover a portion of the top surface of the second interlayered insulating pattern 126. Here, the whole region of the first openings 140 may not be filled with the first spacer layer 138 and the nitride layer 144. Further, the first spacer layer 138 may be formed to partially fill or conformally cover the first recesses 121, whereas the nitride layer 144 may be formed to completely fill the first recesses 121 with the first spacer layer 138. At least one of the first spacer layer 138 and the nitride layer 144 may be formed of or include a silicon nitride layer. In certain embodiments, the first spacer layer 138 and the nitride layer 144 may be formed to have an etch selectivity with respect to each other or have different etch rates from each other.

Figure 8A:
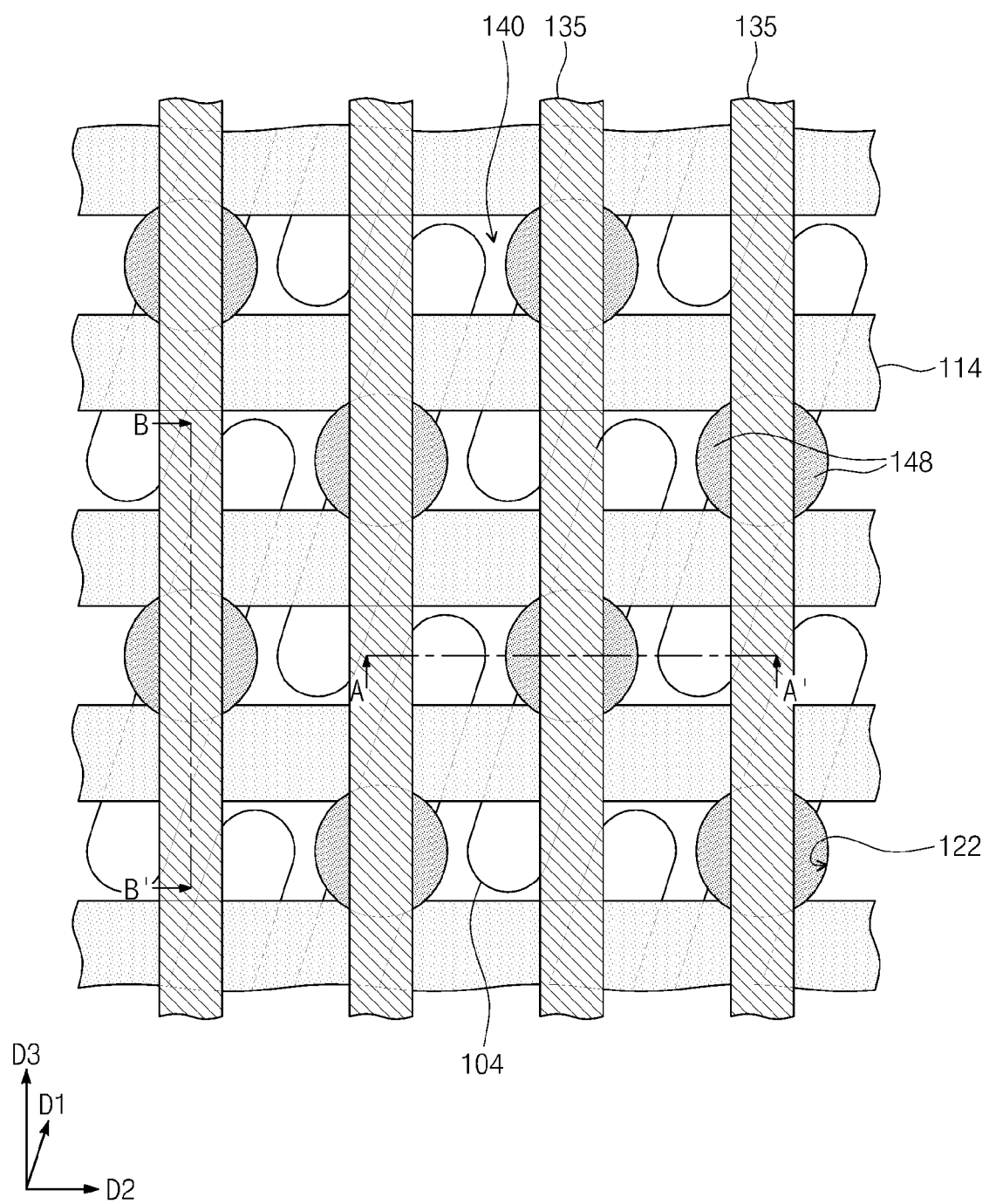
Figure 8B:
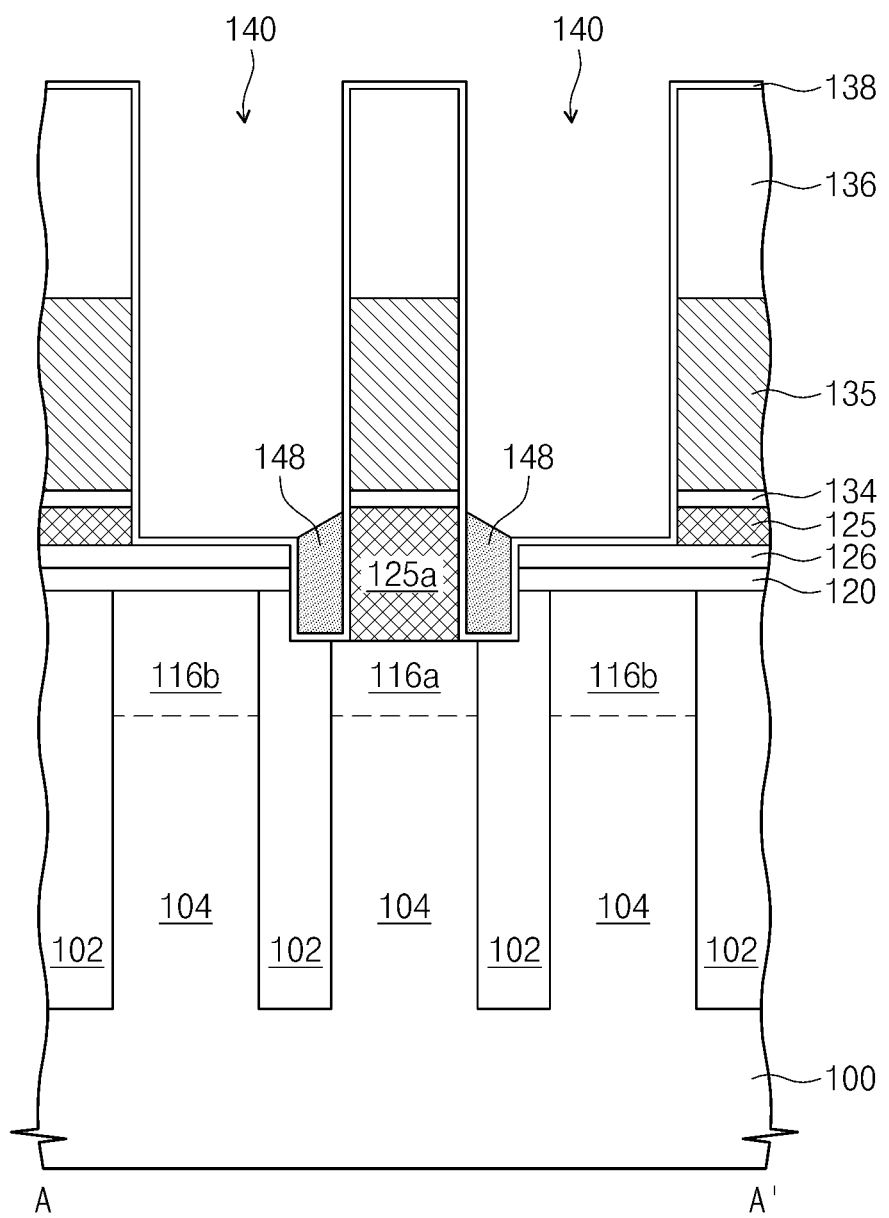
Figure 8C:
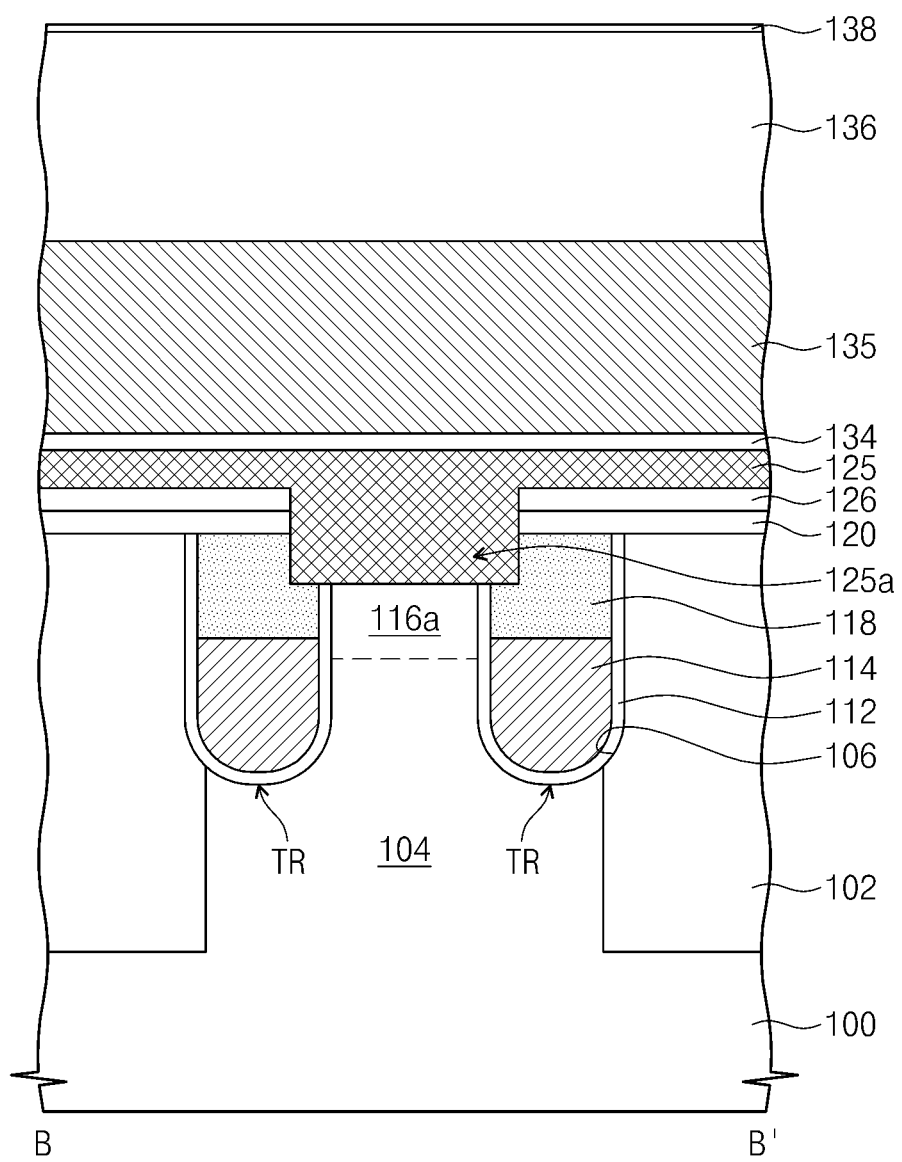

Referring to FIGS. 8A through 8C, the nitride layer 144 may be etched to form the nitride patterns 148. In example embodiments, the nitride layer 144 may be etched using a wet etching process, and in this case, the nitride patterns 148 may be formed to fill the first recesses 121, respectively. For example, the nitride patterns 148 may be formed to cover lower side surfaces of the first contacts 125a, respectively.

The wet etching process may be performed using an etching solution containing at least one of etchants that are selected to realize high etch selectivity between the nitride layer 144 and the first spacer layer 138. For example, the wet etching process may be performed to effectively etch the nitride layer 144 without any etch damage on the first spacer layer 138.

The etching of the nitride layer 144 may be performed in an isotropic manner. Here, as shown in FIG. 7B, the nitride layer 144 may be thicker in the first recess 121 than in any other region, and thus, the etching of the nitride layer 144 may be performed to remove the nitride layer 144 from the first openings 140 but remain the nitride pattern 148 in the first recesses 121.

In example embodiments, the etching of the nitride layer 144 may be performed using at least one of phosphoric acid, sulfuric acid, hydrofluoric acid, and diluted solutions thereof. Further, the etching of the nitride layer 144 may be performed at a temperature ranging from about 100° C. to about 250° C.

Figure 9A:
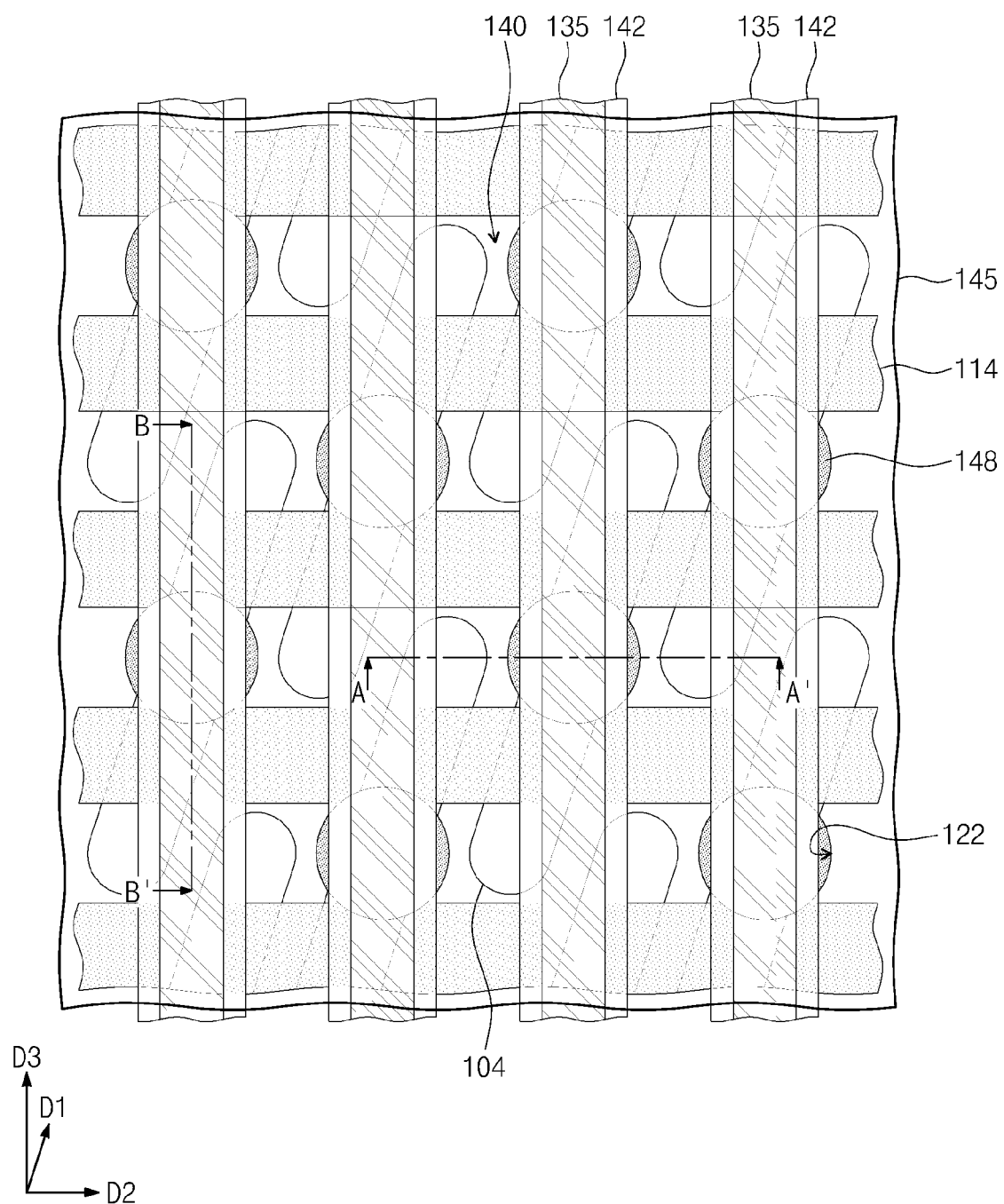
Figure 9B:
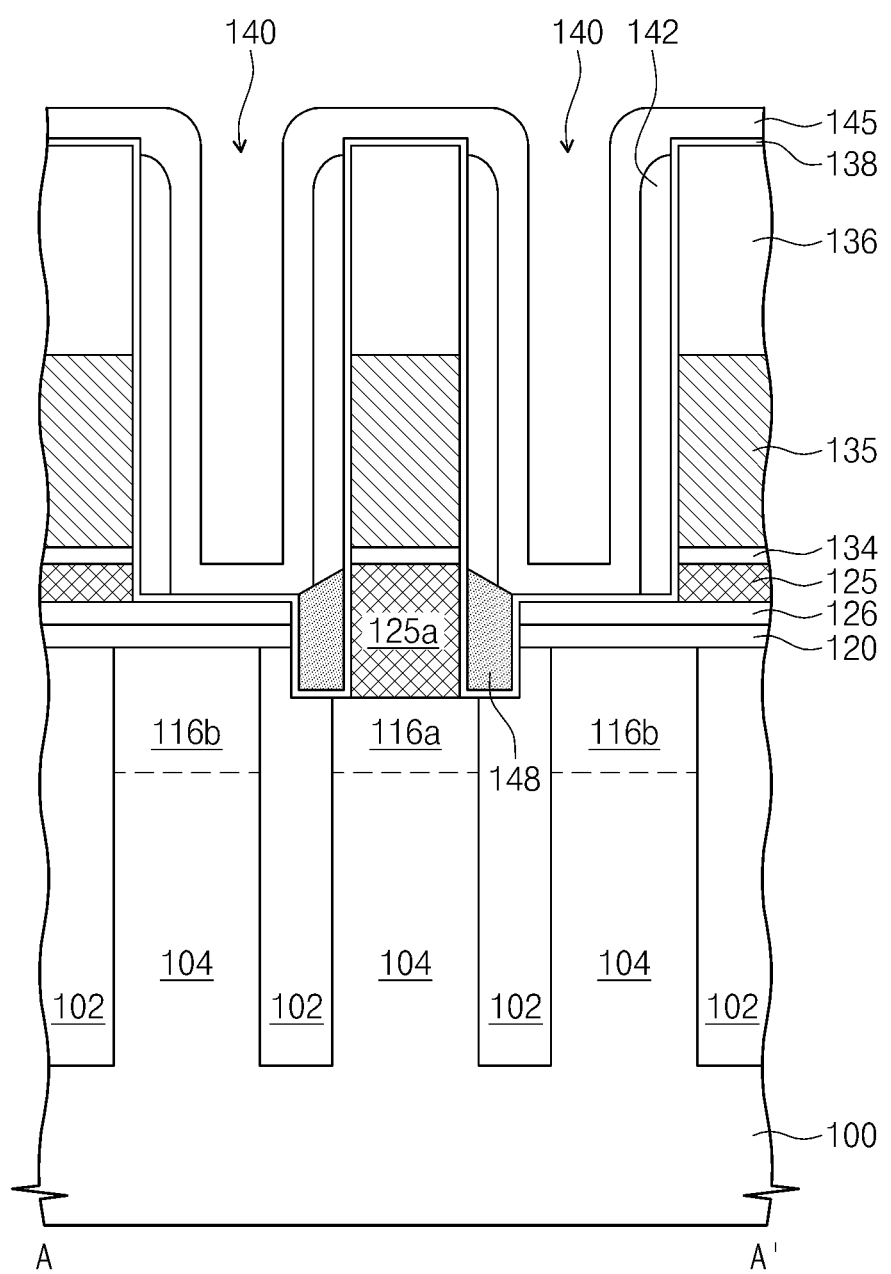
Figure 9C:
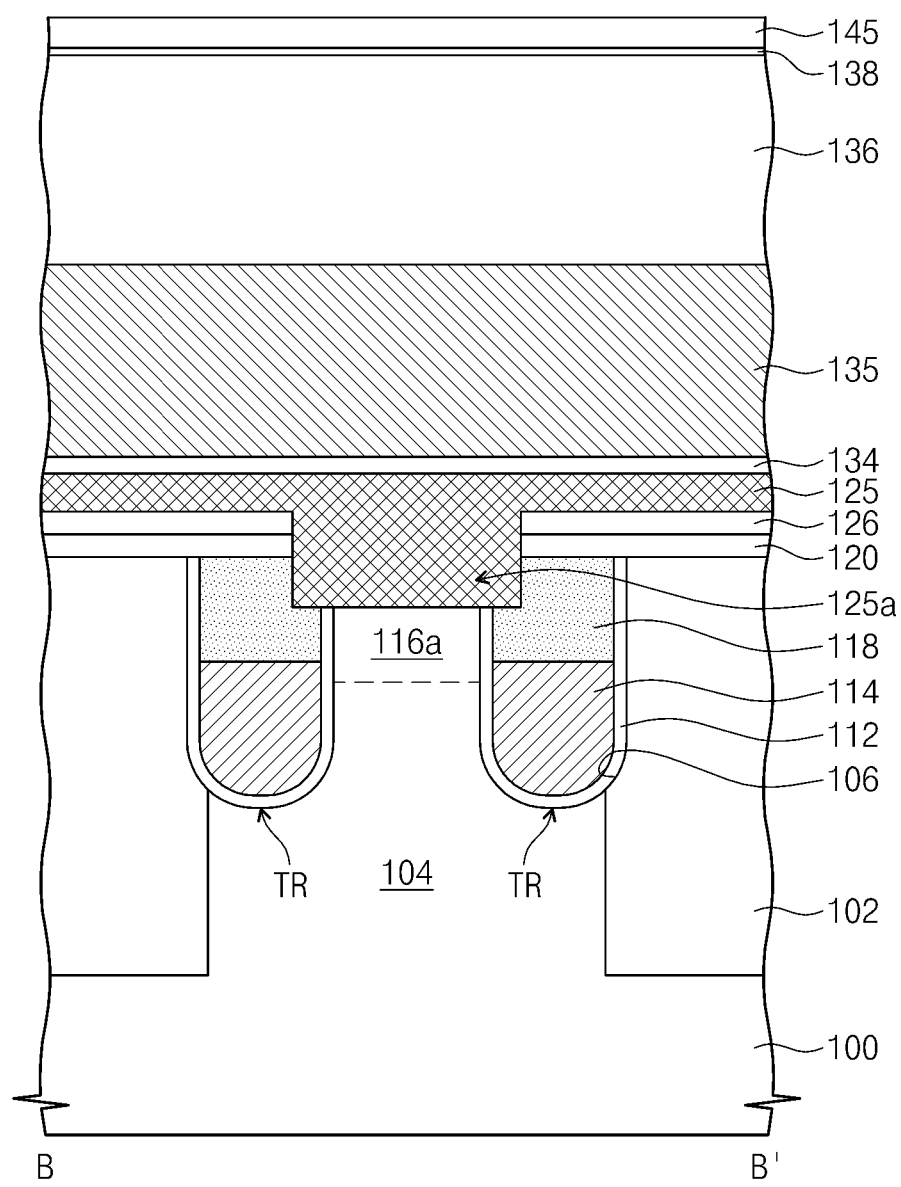

Referring to FIGS. 9A through 9C, the second spacers 142 may be formed on the side surfaces of the bit lines 135. Thereafter, an etch-stop layer 145 may be formed to cover the resulting structure with the second spacers 142. The formation of the second spacers 142 may include forming a second spacer layer (not shown) on the result structure of FIGS. 8A, 8B, and 8C and then anisotropically etching the second spacer layer to form the second spacers 142 on the side surfaces of the bit line stacks. The second spacers 142 may be formed to partially cover the top surface of the nitride patterns 148. The second spacer layer may be formed of or include a silicon oxide layer. The etch-stop layer 145 may be formed of or include a silicon nitride layer.

Figure 10A:
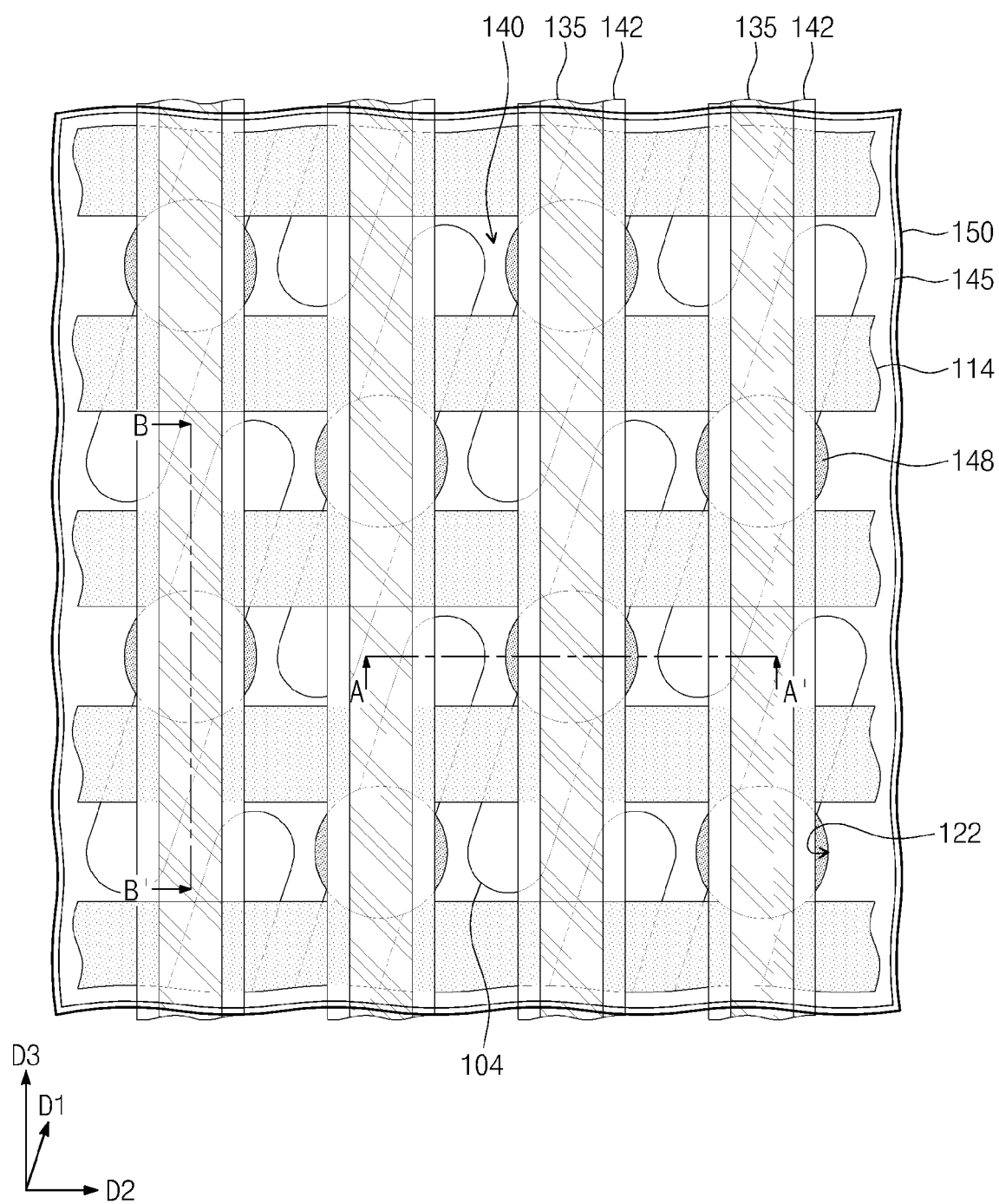
Figure 10B:
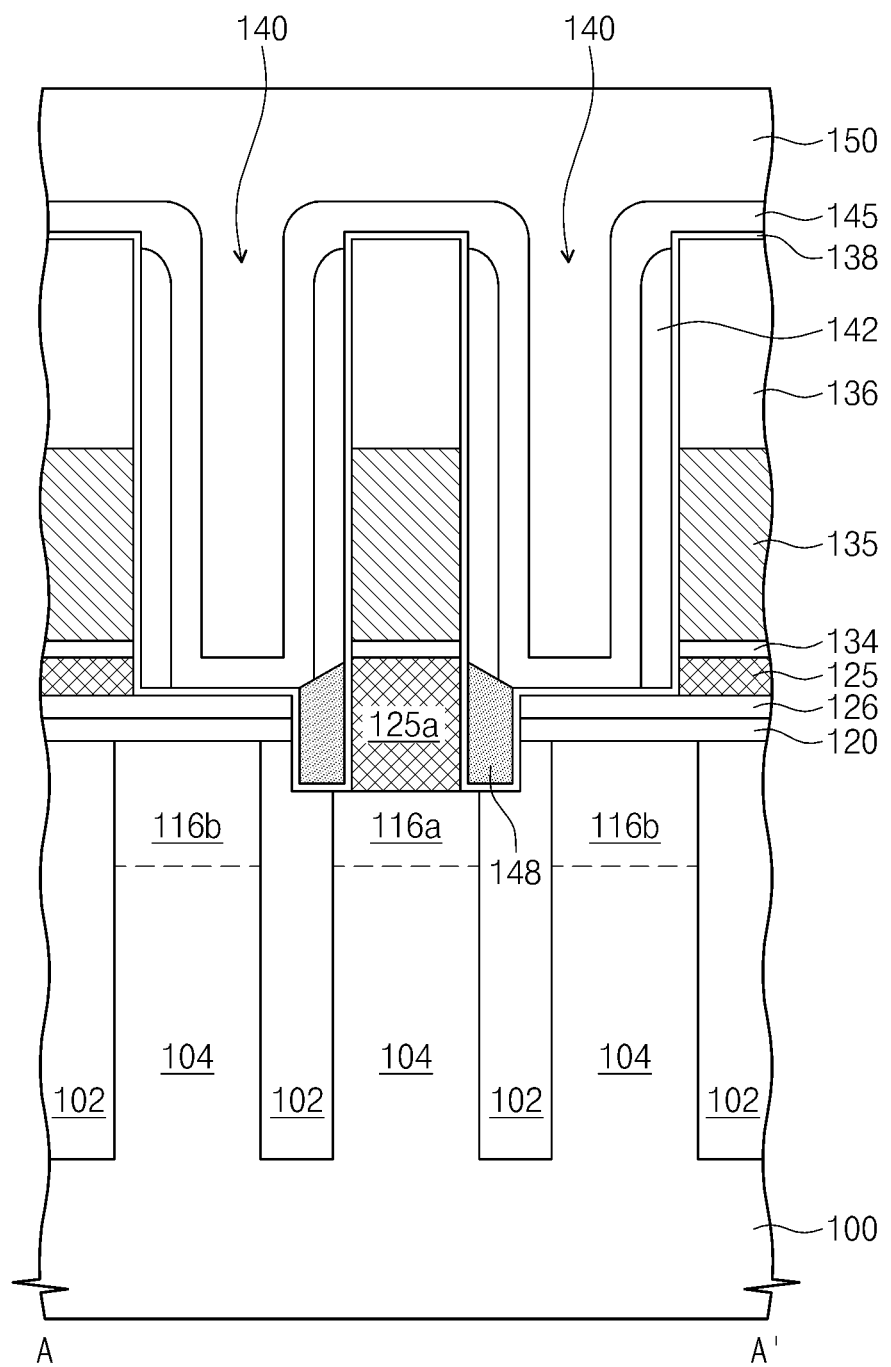
Figure 10C:
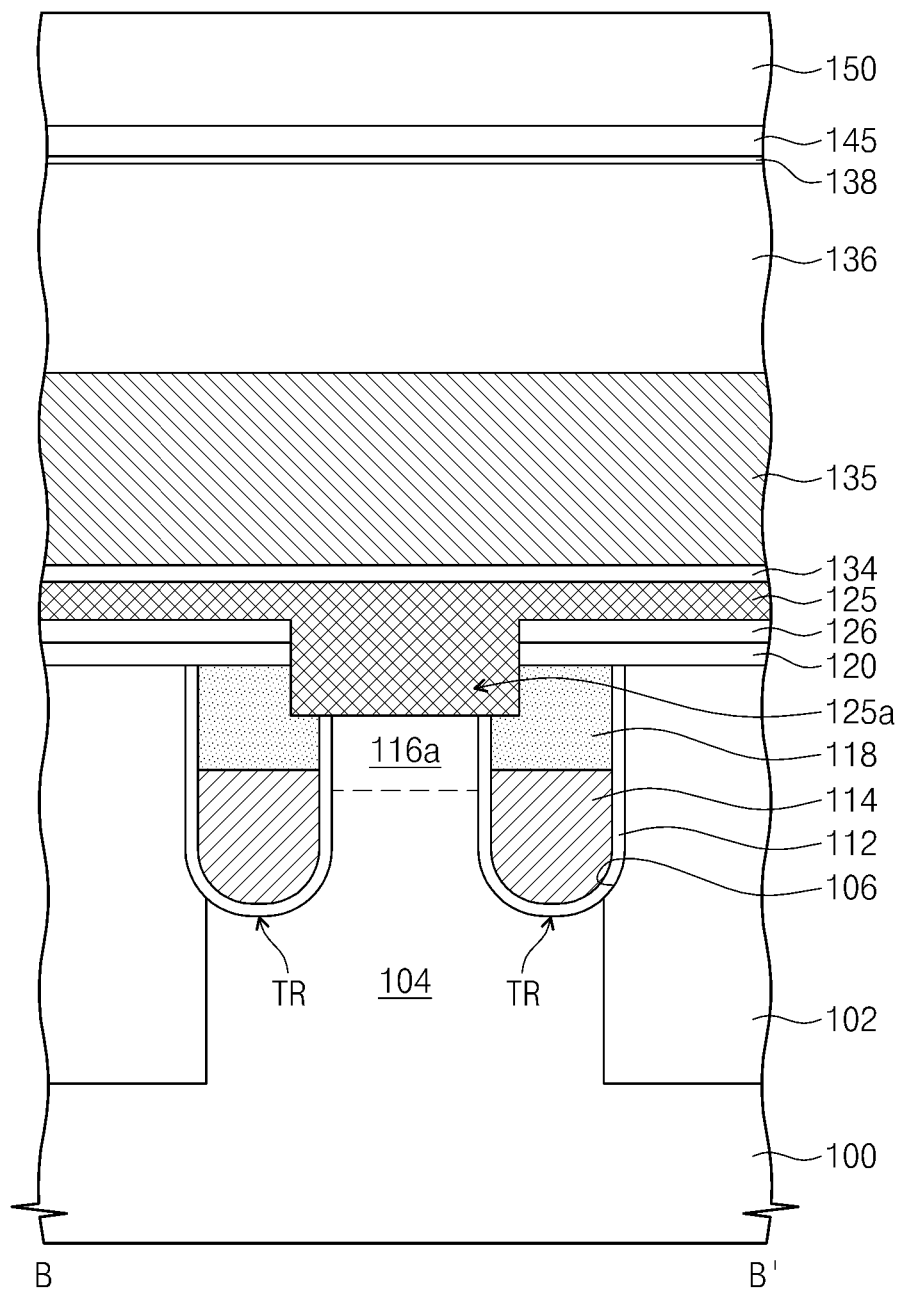

Referring to FIGS. 10A through 10C, a third interlayered insulating layer 150 may be formed on the etch-stop layer 145. The third interlayered insulating layer 150 may be formed to fill the whole space of the first openings 140 provided with the etch-stop layer 145. The third interlayered insulating layer 150 may include a material having an etch selectivity with respect to the etch-stop layer 145. The third interlayered insulating layer 150 may be formed of or include a silicon oxide layer or a silicon oxynitride layer.

Figure 11A:
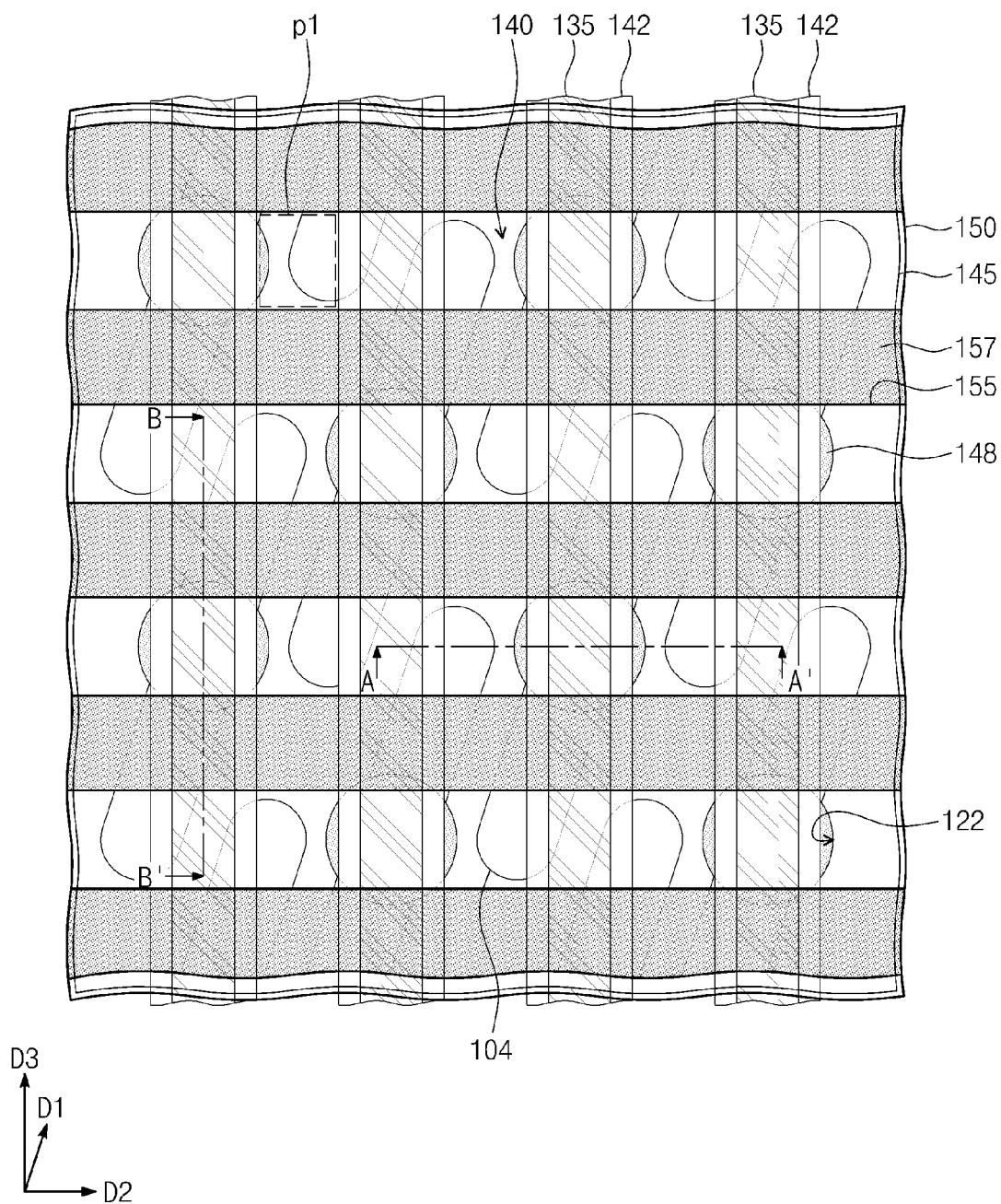
Figure 11B:
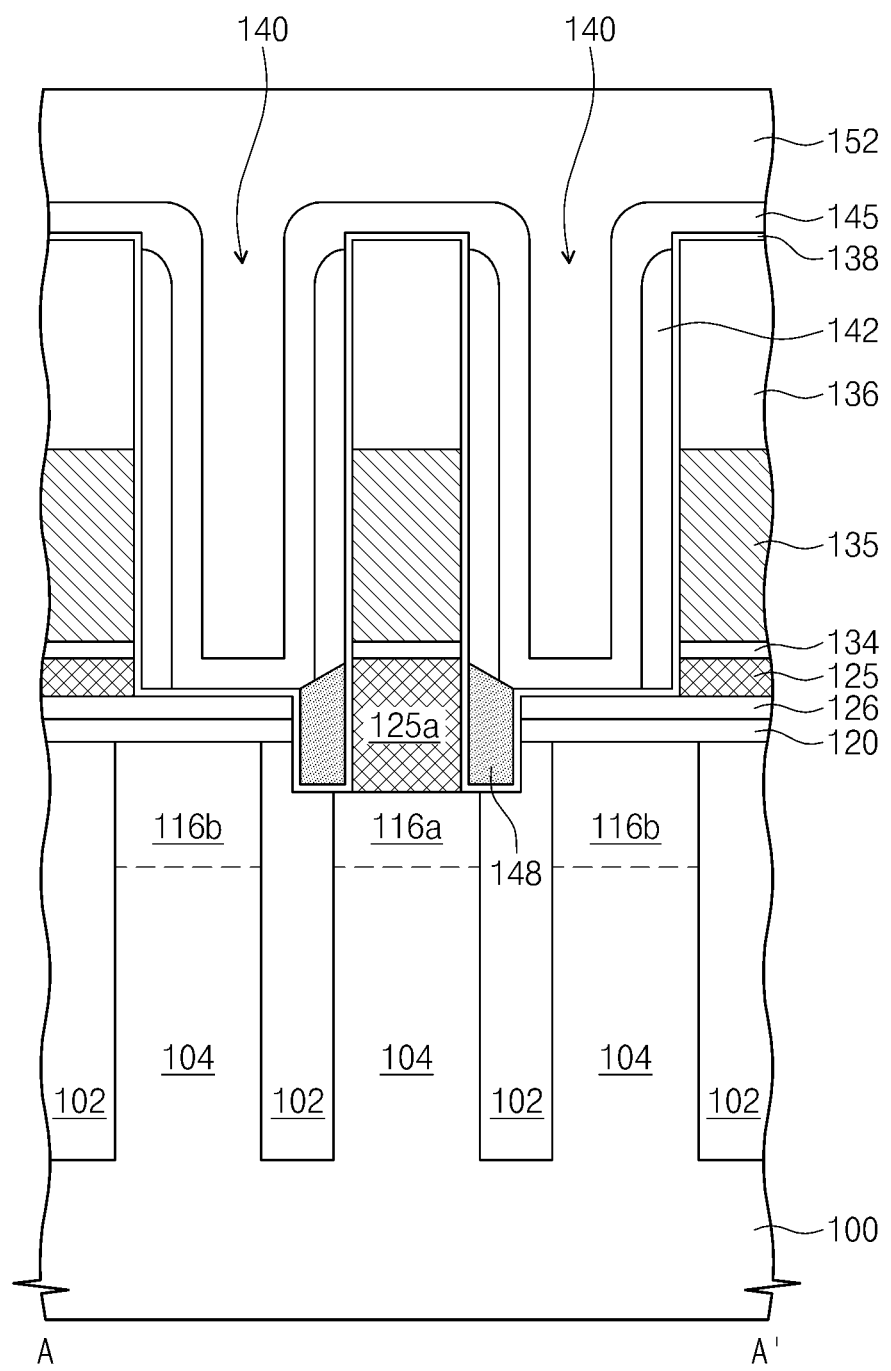
Figure 11C:
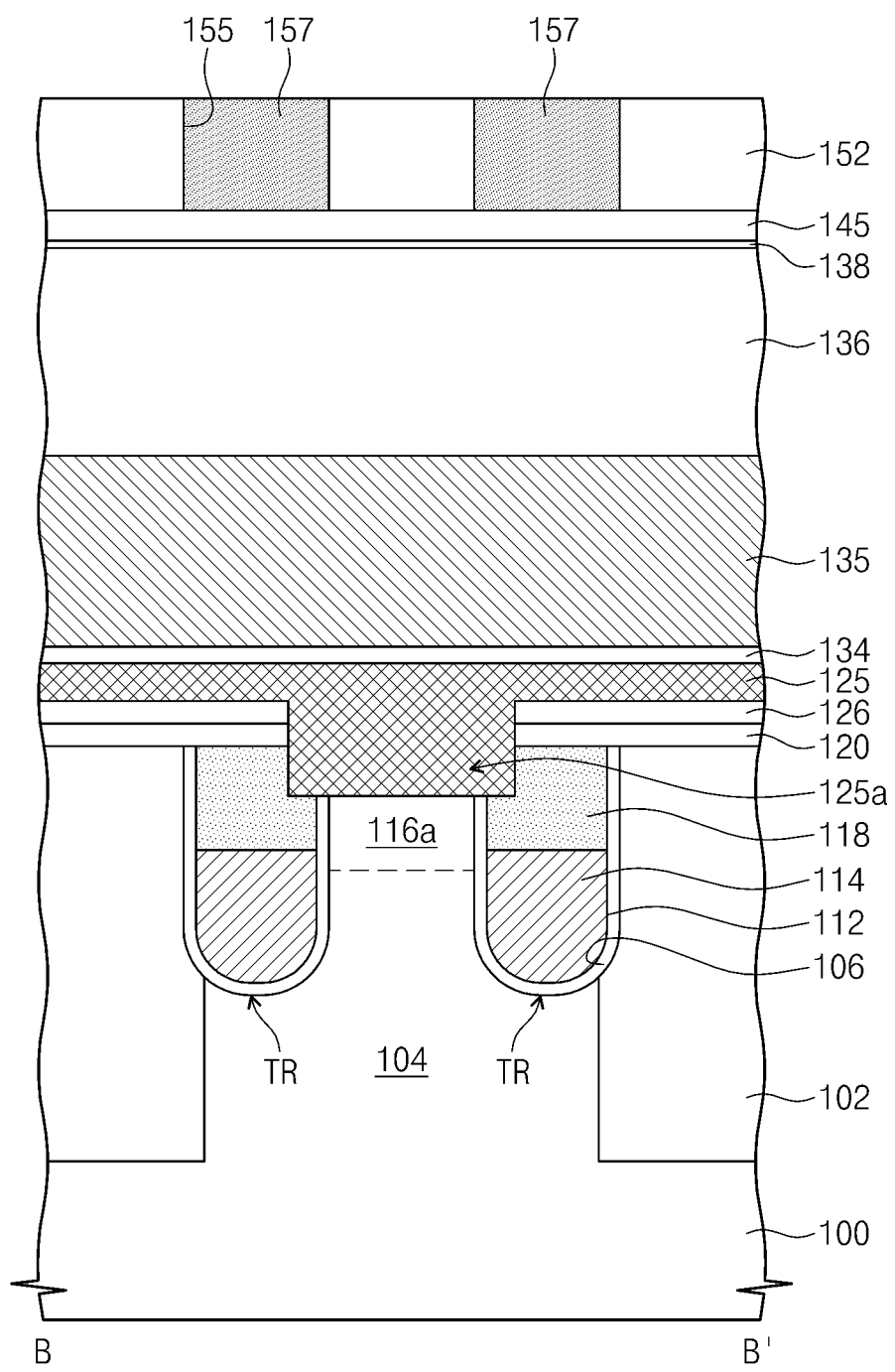

Referring to FIGS. 11A through 11C, the third interlayered insulating layer 150 may be patterned to form second openings 155 and third interlayered insulating patterns 152. Thereafter, third mask patterns 157 may be formed to fill the second openings 155. The second openings 155 may be formed to extend parallel to the second direction D2 and be spaced apart from each other in the third direction D3. When viewed in a plan view, the second openings 155 may be overlapped with the first mask patterns 118 and the gate electrodes 114. The formation of the third mask patterns 157 may include forming a second mask layer (not shown) to fill the second openings 155 and planarizing the second mask layer. Accordingly, when viewed in plan view, the third mask patterns 157 may be overlapped with the first mask patterns 118 and the gate electrodes 114. The second mask layer may include a silicon nitride layer. Since the third and second mask patterns 157 and 136 are formed parallel to the second and third directions D2 and D3, respectively, the third and second mask patterns 157 and 136 may define a plurality of contact regions p1.

Figure 12A:
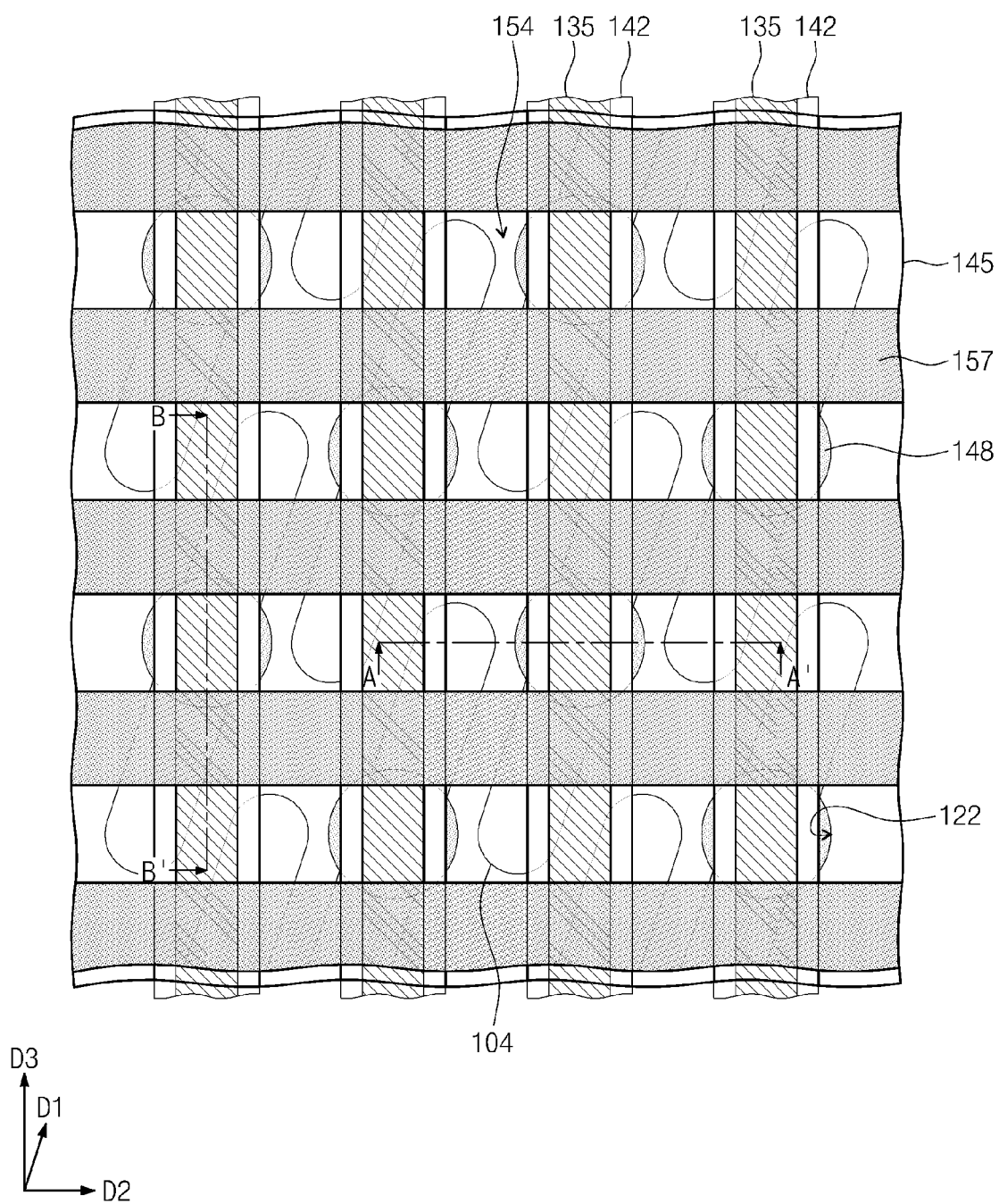
Figure 12B:
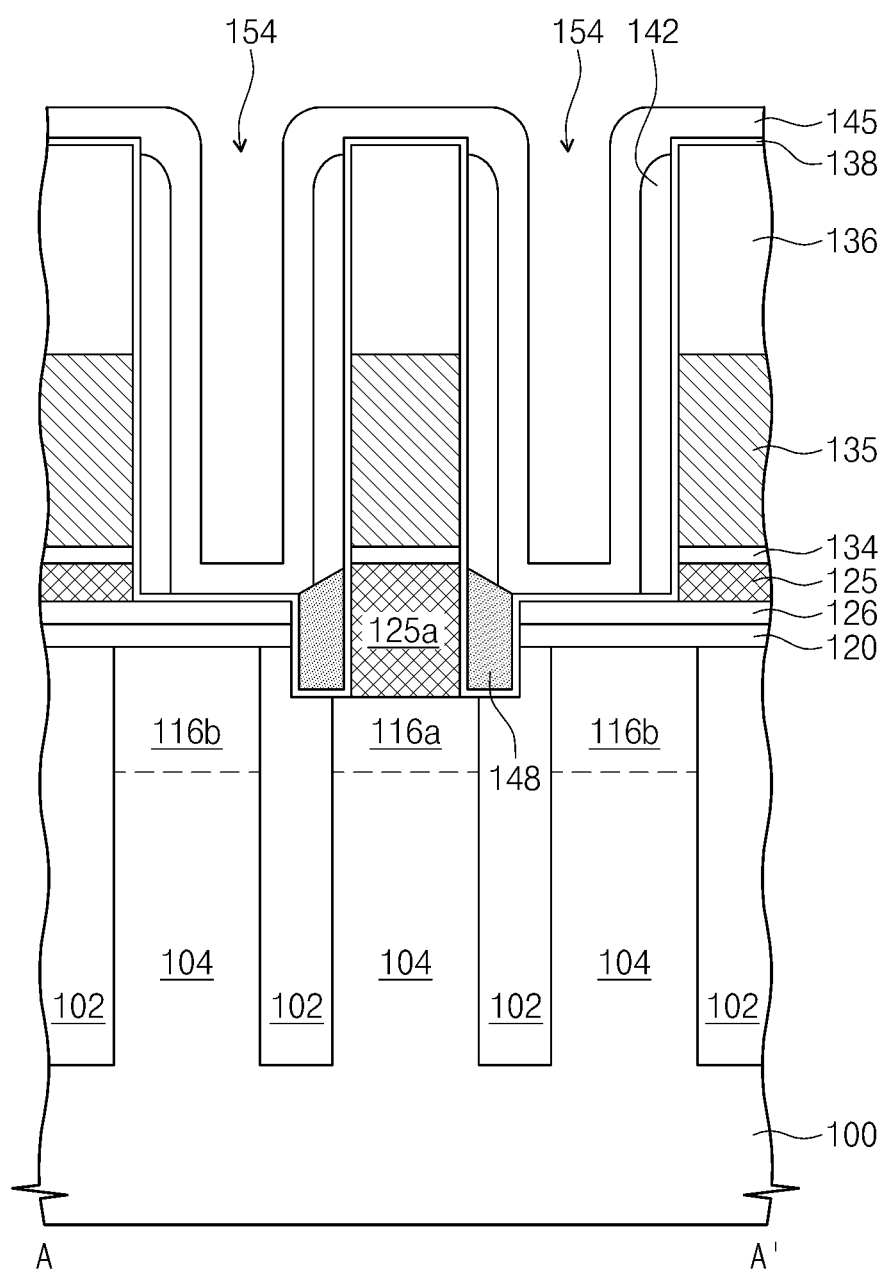
Figure 12C:
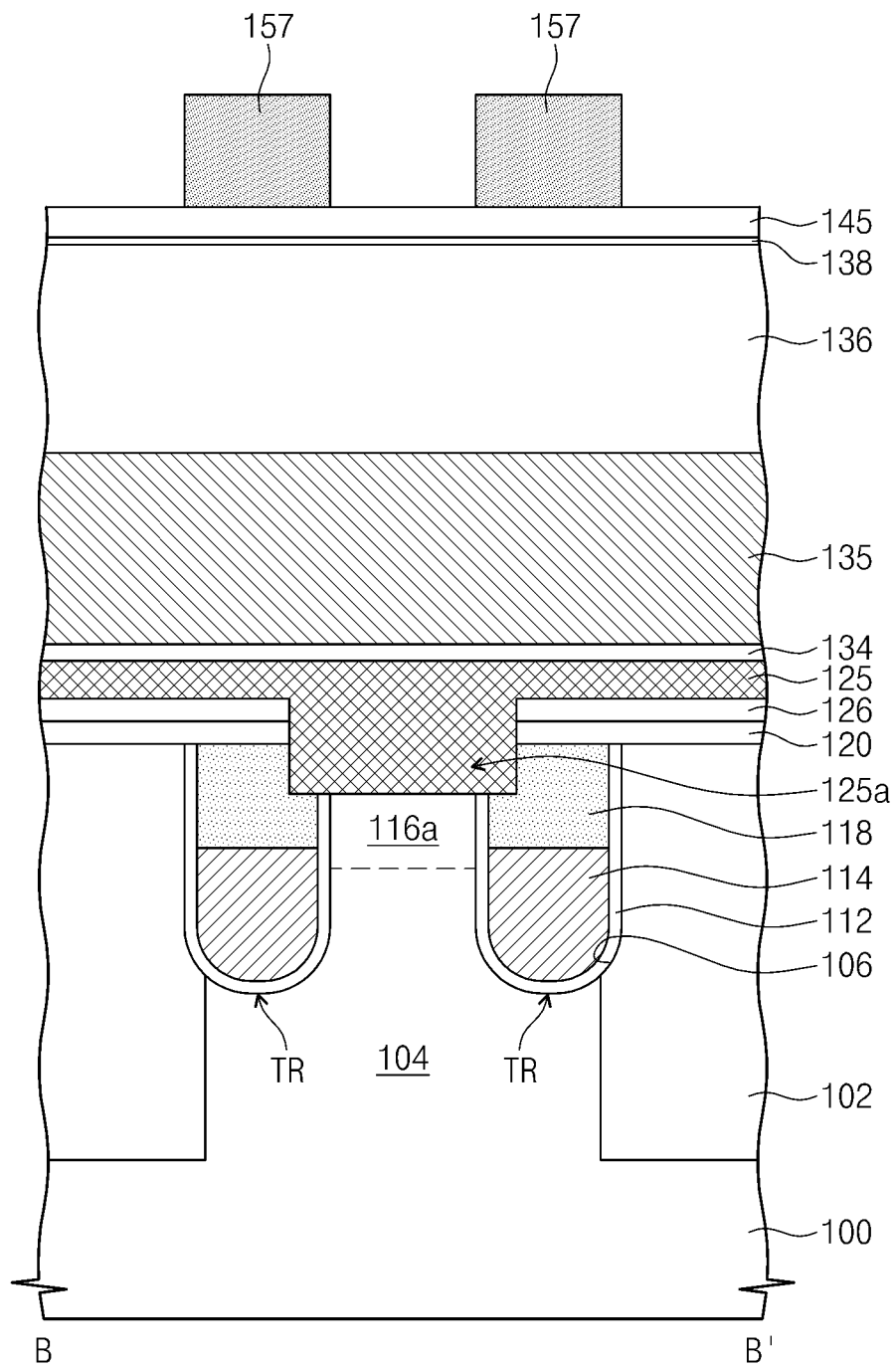

Referring to FIGS. 12A through 12C, the third interlayered insulating patterns 152 may be selectively etched to form second contact holes 154. Since one or both of the etch-stop layer 145 and the third mask patterns 157 is formed of a material having a high etch selectivity with respect to the third interlayered insulating pattern 152, it is possible to selectively remove the third interlayered insulating patterns 152. As a result, the second contact holes 154 may be formed in the contact regions p1, respectively. In other words, the second contact holes 154 may be delimited or enclosed by the third mask patterns 157 and the second mask patterns 136.

Figure 13A:
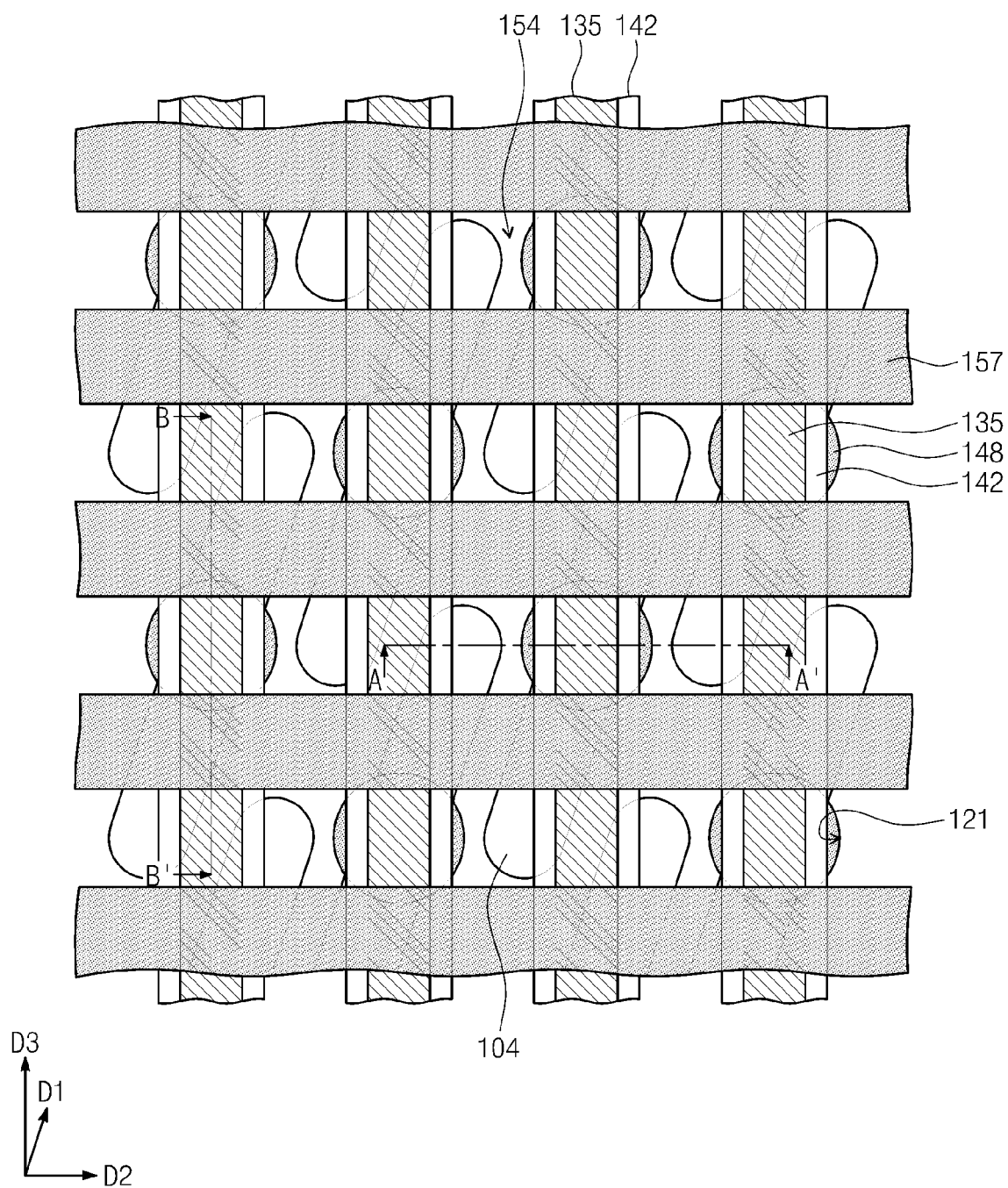
Figure 13B:
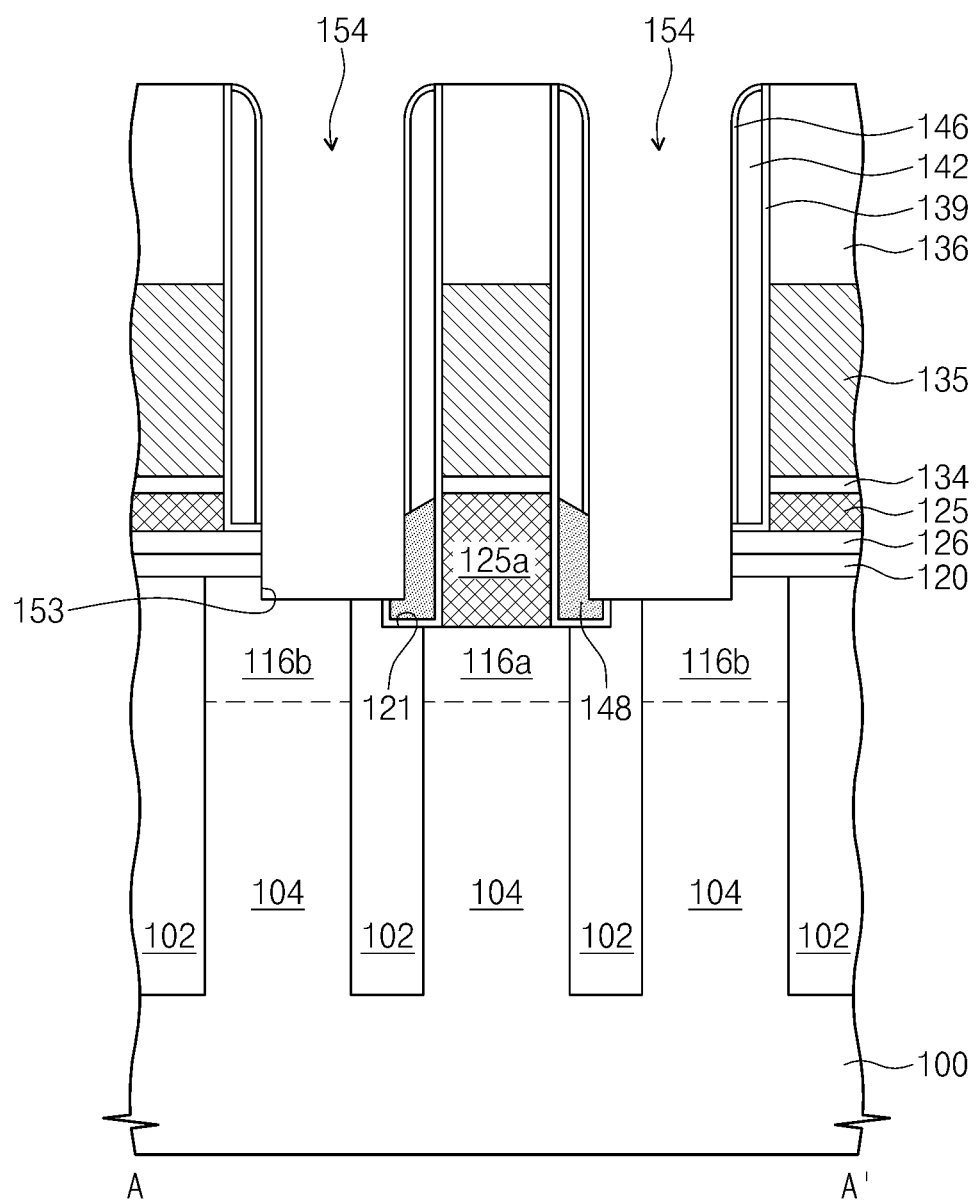
Figure 13C:
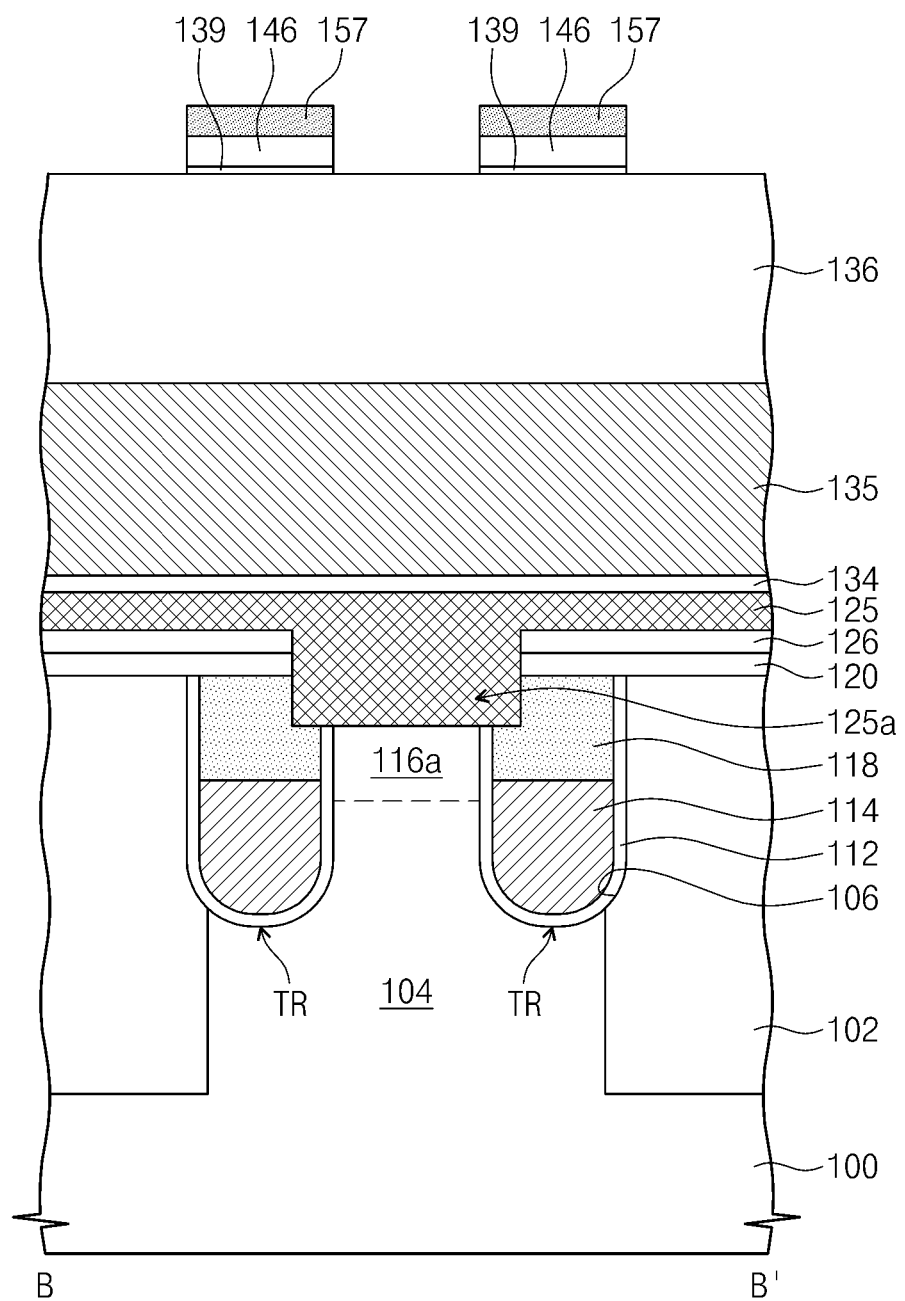

Referring to FIGS. 13A through 13C, the etch-stop layer 145 and the first and second interlayered insulating patterns 120 and 126 may be etched using the second mask patterns 136 and the third mask patterns 157 as an etch mask, and thus, the second contact holes 154 may be expanded. As a result of such an expansion, the second impurity regions 116b and portions of the device isolation pattern 102 adjacent to the second impurity regions 116b may be exposed through the expanded second contact holes 154. According to example embodiments, the etching process may be performed in an over-etching manner. For example, the etching process for forming the second recesses 153 may not be terminated when the top surfaces of the second impurity regions 116b and the device isolation pattern 102 are exposed by the second contact hole 154 and may last until upper portions of the second impurity regions 116b and the device isolation pattern 102 are partially recessed. As an example, the second recesses 153 may be formed to have a depth greater than those of the first recesses 121.

According to example embodiments, the second contact holes 154 may be formed to expose the nitride patterns 148. During the process of etching the etch-stop layer 145 and the first and second interlayered insulating patterns 120 and 126, each of the nitride patterns 148 may serve as an etch stop layer preventing or suppressing the first impurity region 116a, the device isolation pattern 102 adjacent to the first impurity region 116a, and lower portions of the first contact 125a from being etched.

During the process of etching the etch-stop layer 145 and the first and second interlayered insulating patterns 120 and 126, the first spacer layer 138 may be partially etched to form the first spacers 139. Each of the first spacers 139 may be formed to partially cover the top surfaces of the first impurity region 116a and the device isolation pattern 102 and enclose a lower portion of the nitride pattern 148. Further, the etch-stop layer 145 may be etched to form the third spacers 146. In other words, the third spacers 146 may be remaining portions of the etch-stop layer 145. The second spacer 142 may be interposed between the first spacer 139 and the third spacer 146.

Figure 14B:
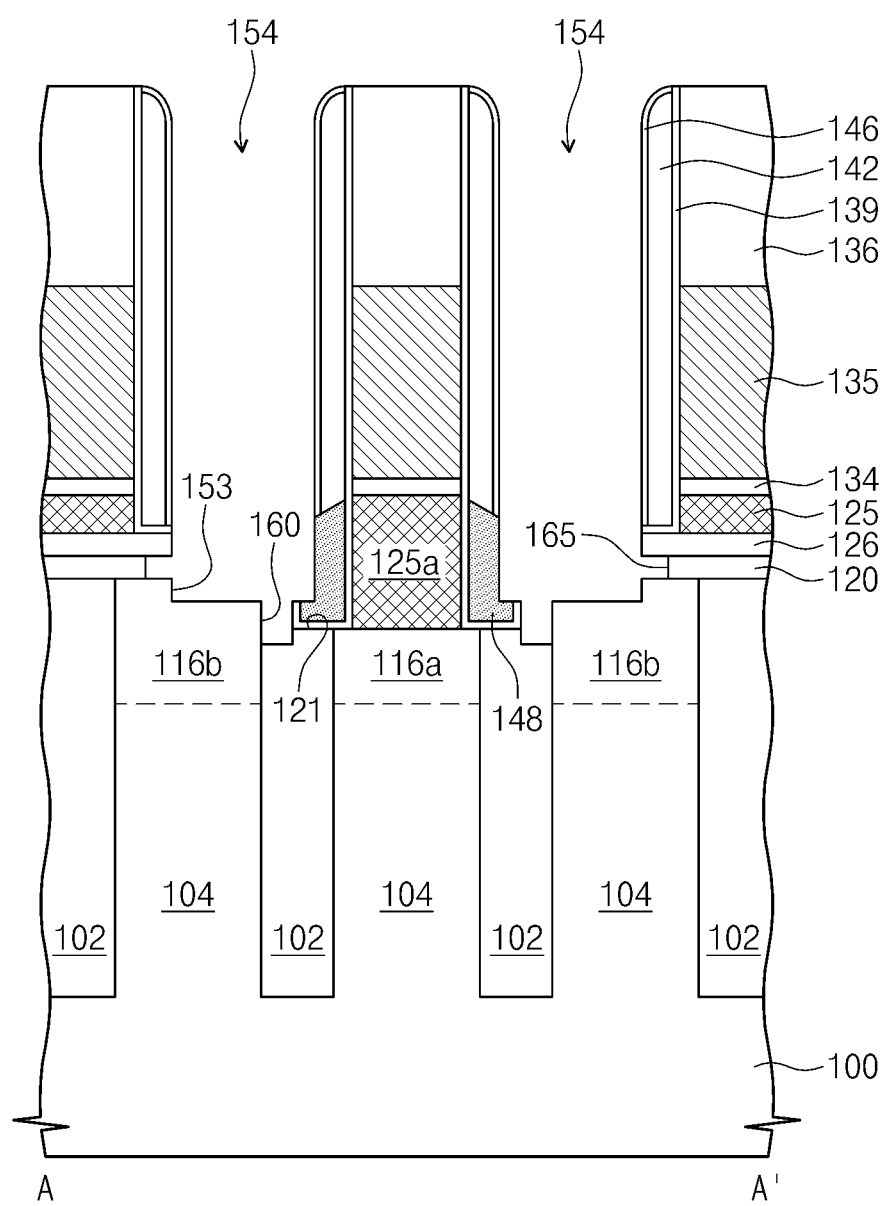

Referring to FIGS. 14A and 14B in conjunction with FIG. 13C, top surfaces of the device isolation patterns 102 exposed by the second contact holes 154 may be further etched to form the third recesses 160. During the formation of the third recesses 160, side surfaces of the first interlayered insulating patterns 120 exposed by the second contact holes 154 may be laterally etched to form the dent regions 165. Each of the third recesses 160 may be formed to expose upper side surfaces of the second impurity regions 116b adjacent thereto. When viewed in plan view, each of the third recesses 160 may be overlapped with the second contact holes 154 and may be formed between the first and second recesses 121 and 153. The third recesses 160 and the dent regions 165 may be continuously connected to the second contact holes 154. When viewed in plan view, the dent region 165 may be overlapped with the first to third spacers 139, 142, and 146, as shown in FIG. 14A.

In example embodiments, the etching process may be a dry etching process, which is performed to selectively etch a silicon oxide layer. In the resulting structure of FIGS. 13A through 13C, only the device isolation patterns 102 and the first interlayered insulating patterns 120 exposed by the second contact holes 154 are silicon oxide patterns with exposed surfaces. Accordingly, during the dry etching process, the exposed upper portions of the device isolation patterns 102 and the exposed side surfaces of the first interlayered insulating patterns 120 may be selectively etched to form the third recesses 160 and the dent regions 165, respectively. The dry etching process may be performed at a temperature ranging from about 20° C. to about 250° C. using an etch gas containing at least one of $NH_3$, HF, Ar, or $N_2$. By contrast, if a wet cleaning process is used to etch the silicon oxide patterns, an etching solution may penetrate an interface between the device isolation pattern 102 and the first spacer layer 138, and in this case, the device isolation pattern 102 may be over-etched to expose the first impurity region 116a. This may lead to an electric short circuit between the first impurity region 116a and the second contact 156, which will be formed in the subsequent process. In this respect, the etching process may be performed using the dry etching process.

Referring back to FIGS. 1A through 1D, the second contacts 156 may be formed in the second contact holes 154, respectively. For example, the formation of the second contacts 156 may include forming a conductive layer (not shown) to fill the second contact holes 154, and then, planarizing the conductive layer to expose the top surfaces of the second mask patterns 136. In this stage, not only the remaining portions of the third mask patterns 157 but also the third and first spacers 146 and 139 positioned below the third mask patterns 157 may be removed, as shown in FIGS. 13C and 1C.

The second contacts 156 may be electrically connected to the second impurity regions 116b. Here, the second contact 156 may be electrically separated from the bit line 135 by the first to third spacers 139, 142, and 146 that are disposed on the side surfaces of the bit lines 135. Further, the second contacts 156 may be electrically separated from the first impurity regions 116a by the nitride patterns 148.

Each of the second contacts 156 may include the vertically-extended portion VE and the horizontally-extended portion HE, which are formed of a conductive material. The vertically-extended portions VE may be formed to fill the third recesses 160, respectively, and the horizontally-extended portions HE may be formed to fill the dent regions 165, respectively.

In a method of fabricating the semiconductor device according to some example embodiments of the inventive concepts, the third recess 160 and the dent region 165 may be formed to be continuously connected to the second contact hole 154, and then, the vertically-extended portion VE and the horizontally-extended portion HE may be formed to fill the third recess 160 and the dent region 165, respectively. Accordingly, it is possible to increase a contact area between the second contact 156 and the second impurity region 116b. This makes it possible to prevent or inhibit the second contacts 156 from being disconnected from the second impurity regions 116b, even when the second contact holes 154 are slightly misaligned.

Further, according to some example embodiments, the nitride patterns 148 may be locally formed between the first contact 125a and a lower portion of the second contact 156, and this localization of the nitride patterns 148 may contribute to reduce a parasitic capacitance between the first and second contacts 125a and 156. In addition, as described above, the nitride patterns 148 may prevent or inhibit the active patterns 104 with the first impurity regions 116a from being etched during the formation of the second contact holes 154.

Figure 15:
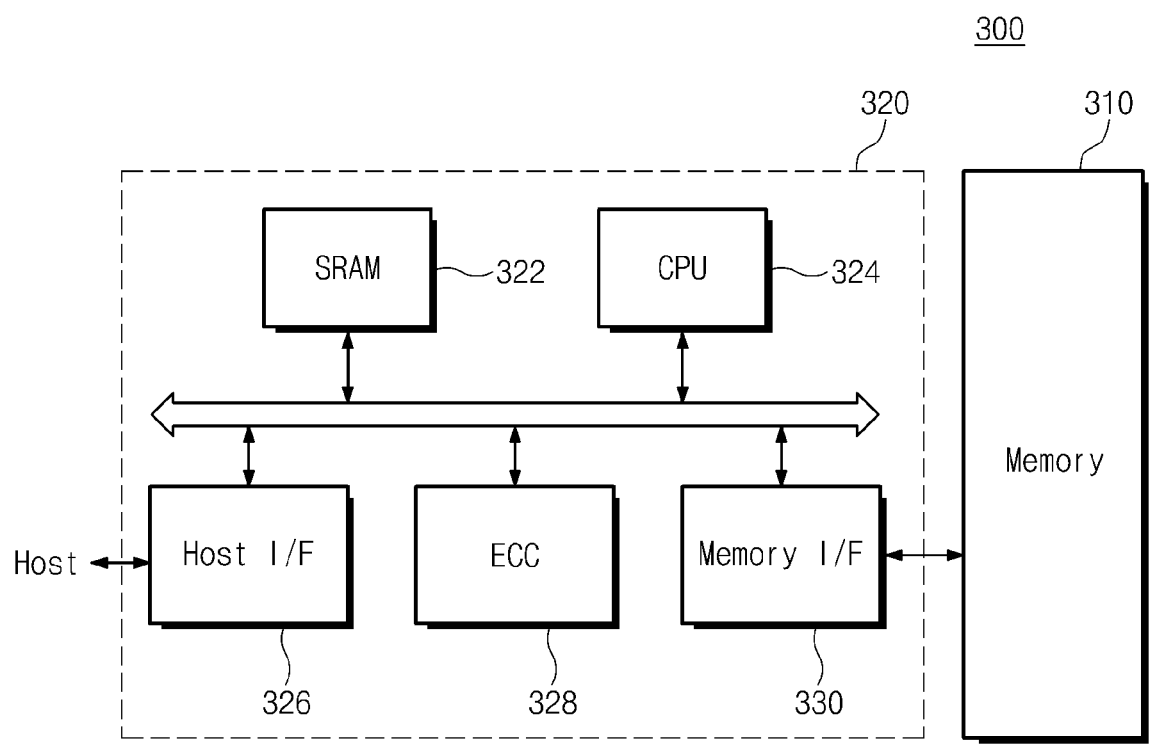
FIG. 15 is a schematic block diagram illustrating an example of a memory card including a memory device according to example embodiments of the inventive concepts.

FIG. 15 is a block diagram illustrating a memory card including a memory device according to the example embodiments of the inventive concepts.

Referring to FIG. 15, a memory device according to example embodiments of the inventive concepts may be applied to form a memory card 300. The memory card 300 may include a memory controller 320 to control a data exchange between a host and a memory device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the memory device 310. A memory interface 330 can interface with the memory device 310. The central processing unit 324 can control data exchange of the memory controller 320 with, for example, the memory device 310.

The memory device 310 in the memory card 300 may be the semiconductor device according to some example embodiments of the inventive concepts. Accordingly, reducing parasitic capacitance between conductive patterns and improve refresh characteristics of the semiconductor device may be possible.

Figure 16:
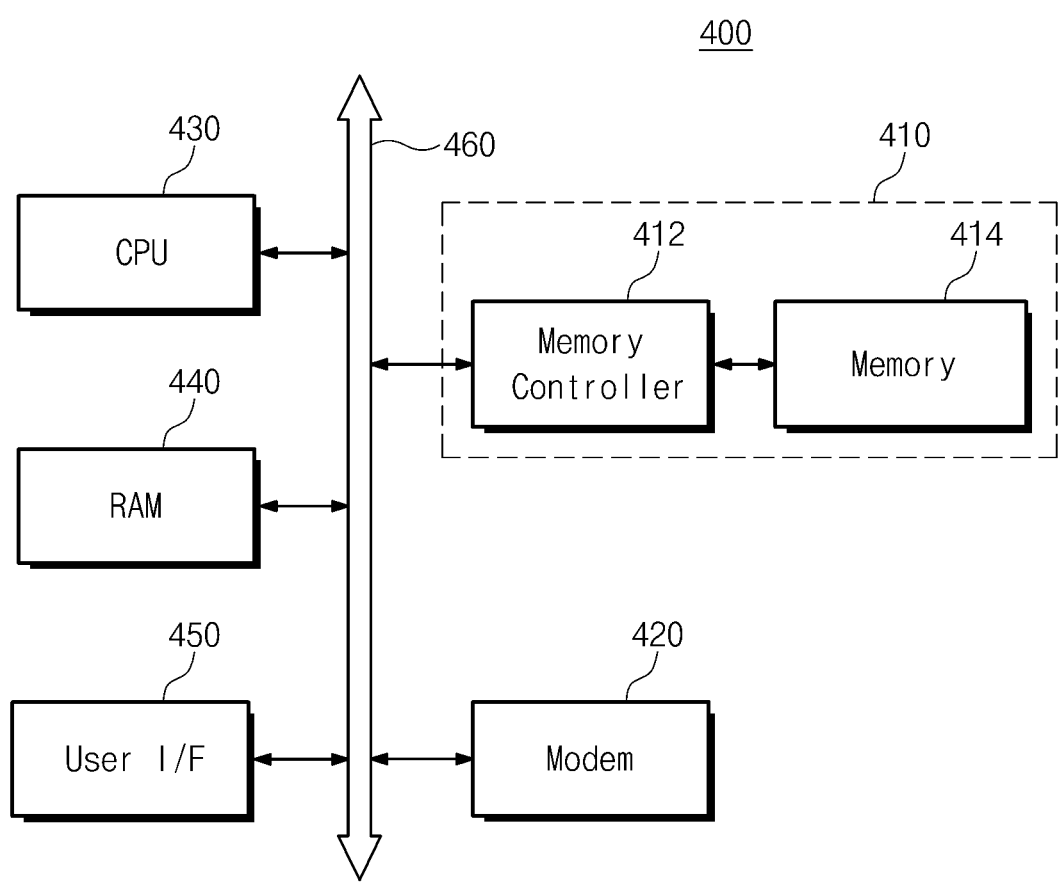
FIG. 16 is a schematic block diagram illustrating an example of an information processing system including a memory device according to example embodiments of the inventive concepts.

FIG. 16 is a block diagram illustrating an information processing system including a memory device according to some example embodiments of the inventive concepts.

Referring to FIG. 16, an information processing system 400 may include a memory device according to example embodiments of the inventive concepts. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 15. The information processing system 400 may be provided as a memory card, a solid state disk, a camera image sensor and an application chip set. For example, the memory system 410 may be a solid state disk (SSD). The information processing system 400 may stably and reliably store data in the memory system 410.

According to example embodiments of the inventive concepts, a contact plug and an impurity region may be in contact with each other with an increased contact area. Accordingly, it is possible to prevent or inhibit a highly-integrated semiconductor device from suffering from an increase of a contact resistance and a contact failure, which may be caused by misalignment of the contact plug. Further, by using a nitride pattern, it is possible to easily form the contact plug with the increased contact area.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   forming a gate electrode in a substrate with active patterns, the active patterns defined by a device isolation pattern;
   forming first and second impurity regions in each of the active patterns and on both sides of the gate electrode;
   forming an interlayered insulating pattern on the substrate with the first and second impurity regions;
   forming a preliminary contact to penetrate the interlayered insulating pattern and be electrically connected to the first impurity region;
   forming a conductive layer on the preliminary contact;
   etching the conductive layer and the preliminary contact to form a bit line crossing the gate electrode and a contact, respectively;
   forming a first contact hole to expose top surfaces of the second impurity region and the device isolation pattern adjacent to the second impurity region; and
   etching the top surface of the device isolation pattern exposed by the first contact hole,
   wherein the forming an interlayered insulating pattern includes,
      forming an interlayered insulating layer on the substrate with the first and second impurity regions, and
      etching the interlayered insulating layer to form a second contact hole exposing a portion of the first impurity region and a portion of the device isolation pattern adjacent to the first impurity region,
   wherein the forming a preliminary contact includes,
      etching the exposed portions of the first impurity region and the device isolation pattern to form a recess region connected to the second contact hole, and
      filling the second contact hole and the recess region with a conductive material, and
   wherein the etching the conductive layer and the preliminary contact includes,
      forming a first mask pattern on the conductive layer, the first mask pattern extending parallel to the bit line,
      etching the conductive layer using the first mask pattern as an etch mask to form the bit line, and
      etching the preliminary contact using the first mask pattern and the bit line as an etch mask to form the contact.

2. The method of claim 1, wherein the forming a first contact hole comprises:
   forming a first spacer to cover a side surface of the bit line;
   forming an etch-stop layer on the substrate to cover the first spacer;
   forming a second mask pattern on the first mask pattern, the second mask pattern extending parallel to the bit line; and
   etching the etch-stop layer and the interlayered insulating pattern using the first and second mask patterns as an etch mask to form the first contact hole.

3. The method of claim 2, further comprising:
   etching a side surface of the interlayered insulating pattern exposed by the first contact hole,
   wherein the etching etches the top surface of the device isolation pattern.

4. The method of claim 1, wherein the etching the top surface of the device isolation pattern selectively etches an oxide layer of the device isolation pattern using a dry etching process.

5. The method of claim 1, further comprising:
   forming a nitride layer on the substrate to fill the recess region and cover side surfaces of the contact and the bit line; and
   performing a wet etching process on the nitride layer to form a nitride pattern in the recess region after the etching the conductive layer and the preliminary contact.

* * * * *